United States Patent
Lee et al.

(10) Patent No.: US 8,714,169 B2
(45) Date of Patent: May 6, 2014

(54) SPIN HEAD, APPARATUS FOR TREATING SUBSTRATE, AND METHOD FOR TREATING SUBSTRATE

(75) Inventors: Taek Youb Lee, Chungcheongnam-do (KR); Jeong Yong Bae, Chungcheongnam-do (KR); Choon Sik Kim, Chungcheongnam-do (KR)

(73) Assignee: Semes Co. Ltd., Chungcheongnam-do (KR)

( * ) Notice: Subject to any disclaimer, the term of this patent is extended or adjusted under 35 U.S.C. 154(b) by 1084 days.

(21) Appl. No.: 12/623,582

(22) Filed: Nov. 23, 2009

(65) Prior Publication Data

US 2010/0126539 A1    May 27, 2010

(30) Foreign Application Priority Data

| Nov. 26, 2008 | (KR) | 10-2008-0118164 |
| Nov. 26, 2008 | (KR) | 10-2008-0118168 |
| Apr. 24, 2009 | (KR) | 10-2009-0035924 |

(51) Int. Cl.
    *B08B 3/00*    (2006.01)
(52) U.S. Cl.
    USPC .......................................................... 134/149
(58) Field of Classification Search
    USPC .......................................... 134/149, 153, 157
    See application file for complete search history.

(56) References Cited

U.S. PATENT DOCUMENTS

| 5,376,216 A | * | 12/1994 | Yoshioka et al. | 156/345.55 |
| 5,954,072 A | * | 9/1999 | Matusita | 134/149 |
| 5,989,342 A | * | 11/1999 | Ikeda et al. | 118/52 |
| 2005/0284369 A1 | * | 12/2005 | Miya et al. | 118/500 |

FOREIGN PATENT DOCUMENTS

| JP | 06291030 A | 10/1994 |
| JP | 09-171984 A | 6/1997 |
| JP | 10-092912 | 4/1998 |
| JP | 10-209254 | 8/1998 |
| JP | 10335287 A | * 12/1998 |
| JP | 11-195630 A | 7/1999 |
| JP | 2004-115872 A | 4/2004 |
| JP | 2006-253210 A | 9/2006 |
| KR | 10-1998-0070712 A | 10/1998 |
| KR | 10-0340154 B1 | 7/2001 |
| KR | 10-0370636 B1 | 1/2003 |
| KR | 1020030043739 | 6/2003 |
| KR | 1020080048133 | 6/2008 |

OTHER PUBLICATIONS

Machine Translation of Ino et al., JP 10335287 A, Dec. 1998.*

* cited by examiner

*Primary Examiner* — David Cormier
(74) *Attorney, Agent, or Firm* — Carter, DeLuca, Farrell & Schmidt, LLP

(57) ABSTRACT

Provided is a spin head supporting a substrate and rotating the substrate. The spin head includes a body, chuck pins installed on the body and moving between supporting positions where a substrate is supported and waiting positions providing space for loading/unloading of the substrate, and a chuck pin moving unit configured to move the chuck pins. The chuck pin moving unit includes a rotation rod coupled with each of the chuck pins, a pivot pin fixing the rotation rod to the body, and a driving member rotating the rotation rod about the pivot pin as a rotation shaft to move the chuck pin from the supporting position to the waiting position. When the body rotates, the rotation rod uses reverse centrifugal force to apply force to the chuck pin from the waiting position to the supporting position. The chuck pins include first pins and second pins that alternately chuck a substrate during a process.

28 Claims, 28 Drawing Sheets

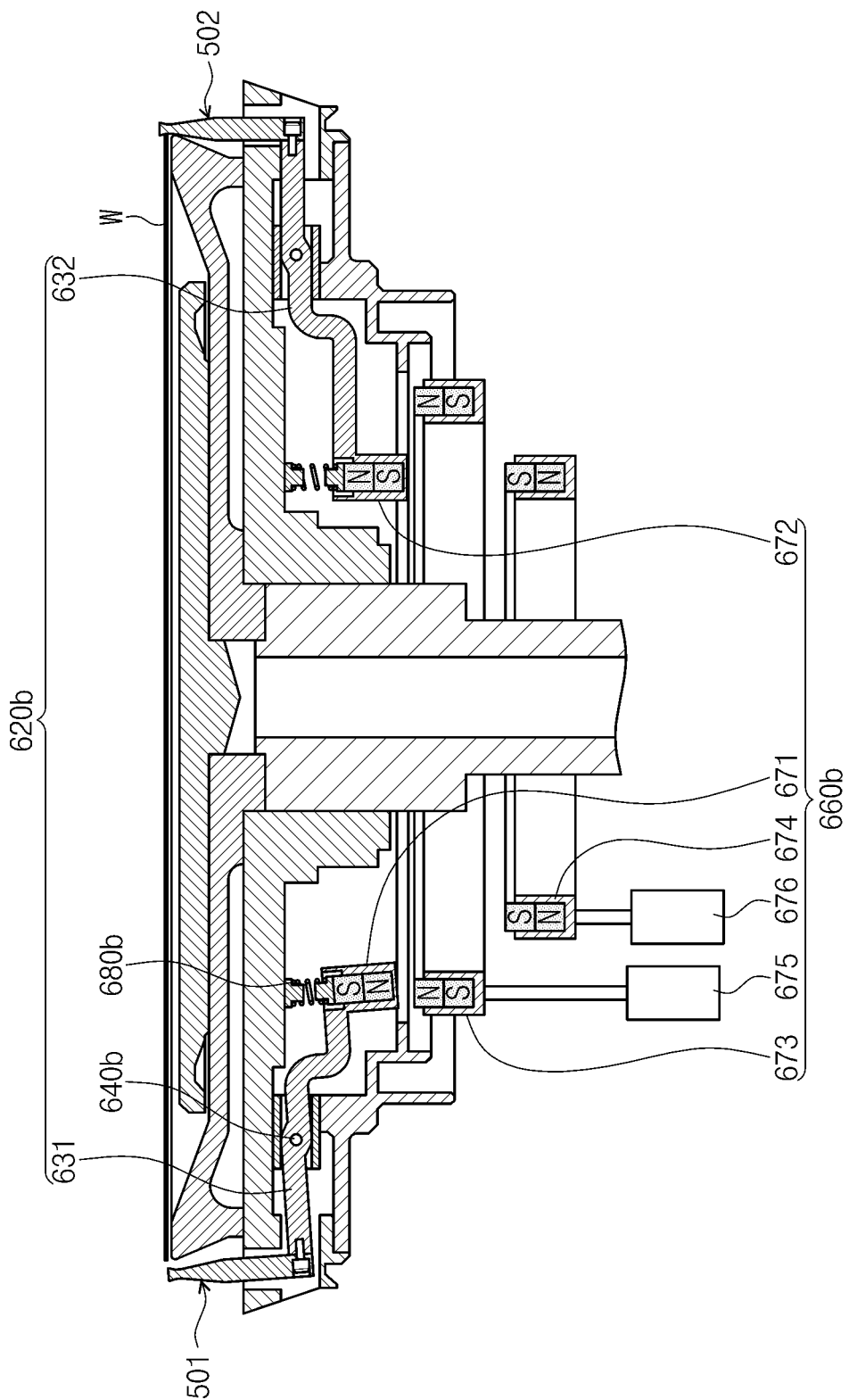

SPIN HEAD, APPARATUS FOR TREATING SUBSTRATE, AND METHOD FOR TREATING SUBSTRATE

CROSS-REFERENCE TO RELATED APPLICATIONS

This U.S. non-provisional patent application claims priority under 35 U.S.C. §119 of Korean Patent Application Nos. 10-2008-0118168, filed on Nov. 26, 2008, 10-2008-0118164, filed on Nov. 26, 2008, and 10-2009-0035924, filed on Apr. 24, 2009, the entire contents of which are hereby incorporated by reference.

BACKGROUND OF THE DISCLOSURE

The present disclosure disclosed herein relates to an apparatus for treating a substrate and a method for treating a substrate, and more particularly, to a rotatable spin head supporting a substrate in a process such as a semiconductor process, and an apparatus and a method for treating the substrate using the spin head.

A semiconductor process includes a process of etching or cleaning thin layers, foreign substances, and particles on a wafer. Such an etching or cleaning process is performed by placing a wafer on a spin head such that a surface of a pattern faces upward or downward, rotating the spin head at a high speed, and supplying process liquid on the wafer. The spin head is provided with chuck pins that support the lateral portion of a wafer to prevent the wafer from moving in the lateral direction of the spin head when the wafer is rotated. The chuck pins move between waiting positions providing a space where a substrate is placed when the substrate is loaded on or unloaded from the spin head and supporting positions contacting the lateral portion of the substrate when the substrate placed on the spin head is rotated and a process is performed. Thus, the space provided between the chuck pins placed at the waiting positions is greater than the space provided between the chuck pins placed at the supporting positions.

In general, when chuck pins are placed at supporting positions to support a substrate, centrifugal force due to the rotation of the substrate is applied to the chuck pins toward waiting positions. When the chuck pins are moved to the waiting positions by centrifugal force during a process, it is difficult for the chuck pins to stably support the substrate, thus causing defects in products.

In addition, a spin head is provided with chuck pins that are classified into two groups, and the group of the chuck pins supporting a substrate is changed during a process. In this case, three chuck pins are typically provided to each of the groups. However, when the three chuck pins support a substrate with one of the three chuck pins being disposed in a notch of the substrate, the substrate are supported substantially by the two chuck pins. For this reason, it is difficult for the chuck pins to stably support the substrate, thus causing defects in products.

SUMMARY OF THE DISCLOSURE

The present disclosure provides a spin head configured to stably support a substrate, a substrate treating apparatus including the spin head, and a substrate treating method using the spin head.

The present disclosure also provides a spin head configured to stably maintain chuck pins at contact positions with the lateral portion of a substrate even at a high speed, a substrate treating apparatus including the spin head, and a substrate treating method using the spin head.

The present disclosure also provides a spin head configured to stably support a substrate even when one of chuck pins faces a notch of the substrate, a substrate treating apparatus including the spin head, and a substrate treating method using the spin head.

Embodiments of the present disclosure provide spin heads including: a body; chuck pins protruding upward from the body; and a chuck pin moving unit configured to move the chuck pins between supporting positions where a lateral portion of a substrate placed on the spin head is supported and waiting positions that are farther from a center of the body than the supporting positions are so as to allow the substrate to be placed on the body, wherein the chuck pin moving unit includes: a rotation rod coupled with each of the chuck pins; a pivot pin fixing the rotation rod to the body; and a driving member rotating the rotation rod about the pivot pin as a rotation shaft.

In some embodiments, when the body rotates, the rotation rod may use reverse centrifugal force to apply force to the chuck pin from the waiting position to the supporting position. The rotation rod may include: a first part that is a region coupled with the chuck pin with respect to the pivot pin; and a second part that is an opposite region to the first part with respect to the pivot pin, wherein the second part includes: a first line portion; and a second line portion that is parallel to the first line portion and is lower than the first line portion. The second part may further include a third line portion extending from the first line portion to the second line portion. The second line portion may be perpendicular to the first and third line portions. The first part may include a line portion extending from the first line portion and parallel to the second line portion, and the line portion of the first part may be higher than the second line portion of the second part. An end of the second part, which is adjacent to the center of the body, may be lower than an end of the first part, which is farthest from the center of the body.

In other embodiments, the body may include a stopper having a through hole with an open front portion and an open rear portion, the rotation rod passes through the through hole, the pivot pin configured to couple the rotation rod to the stopper in the through hole, and the through hole has a cross section greater than that of the rotation rod.

In still other embodiments, the driving member may use magnetic force to move the chuck pin from the supporting position to the waiting position. The driving member may include: a driven magnet coupled to the second part of each of the rotation rods; and a driving magnet facing the driven magnets under the driven magnets, wherein the driven magnet and the driving magnet have identical poles facing each other. The driving magnet may have a ring shape. The driven magnet and the driving magnet may include permanent magnets, and the driving member may further include a driver configured to vertically move the driving magnet.

In even other embodiments, the spin heads may further includes an elastic member coupled to the rotation rod and the body and rotating the rotation rod to apply force to the chuck pin from the waiting position to the supporting position. The elastic member may include a spring, wherein the spring has an end coupled to the second part of the rotation rod, and the other end coupled to the body at an upper side of the rotation rod.

In yet other embodiments, a sum of a weight of the second part and a weight of the driven magnet may be greater than a sum of a weight of the first part and a weight of the chuck pin.

In further embodiments, one part of the chuck pins may be classified into a first group, and the other part of the chuck pins may be classified into a second group, wherein the rotation rods includes: first rods coupled with the chuck pins constituting the first group; and second rods coupled with the chuck pins constituting the second group, wherein the driving member includes: first driven magnets connected to the first rods; second driven magnets connected to the second rods; a first driving magnet facing the first driven magnets; and a second driving magnet facing the second driven magnets. The first driven magnets may be farther from the center of the body than the second driven magnets are, and the first and second driving magnets may have ring shapes, respectively.

In still further embodiments, the first driven magnet, the second driven magnet, the first driving magnet, and the second driving magnet, may respectively include permanent magnets, and the driving member may further include: a first driver vertically moving the first driving magnet; and a second driver vertically moving the second driving magnet. The first driving magnet and the first driven magnet may have identical poles facing each other, the second driving magnet and the second driven magnet may have identical poles facing each other, and an upper surface of the first driving magnet and an upper surface of the second driving magnet may have different poles from each other. The first rod and the second rod may have different lengths from each other, the first driven magnet may be provided to an end of the first rod, and the second driven magnet may be provided to an end of the second rod.

In even further embodiments, the number of the chuck pins provided to each of the first group and the second group may be five or greater, and the chuck pins included in the first group and the chuck pins included in the second group may be disposed alternately.

In yet further embodiments, the chuck pins each may include: a base; and a contact fixed to the base and protruding from the base to the center of the body such that the contact is adapted to be in contact with the substrate, wherein the contact is provided in plurality. The contacts may be spaced apart from each other in a perpendicular direction to longitudinal directions respectively of the contacts.

In much further embodiments, the body may include: a lower plate at which the chuck pin moving unit is installed; an upper plate installed at an upper portion of the lower plate and having a concave space in an upper surface; and a guide plate disposed in the concave space, wherein a through hole vertically passing through a center of the lower plate, a through hole disposed in a center of the upper plate and communicating with the through hole of the lower plate, and a conduit in which gas supplied through the through hole of the upper plate and the through hole of the lower plate flows is provided to a bottom surface of the guide plate. The conduit may include: a ring-shaped buffer space disposed at an edge of the guide plate; a passage, as a recess, disposed in the bottom surface of the guide plate and connecting the buffer space to the through hole of the upper plate; and a ring-shaped concave disposed in the bottom surface of the guide plate and extending from the buffer space to an outer end of the guide plate.

In other embodiments of the present disclosure, spin heads include: a body; first pins and second pins protruding upward from the body; and a chuck pin moving unit configured to move the first and second pins between supporting positions where a lateral portion of a substrate placed on the spin head is supported and waiting positions that are farther from a center of the body than the supporting positions are so as to allow the substrate to be placed on the body, wherein the chuck pin moving unit includes: first rods coupled with the first pins and coupled to the body through pivot pins; second rods coupled with the second pins and coupled to the body through pivot pins; a first driven magnet connected to the first rod; a second driven magnet connected to the second rod; a first driving magnet facing the first driven magnet; a second driving magnet facing the second driven magnet; a first driver vertically moving the first driving magnet; and a second driver vertically moving the second driving magnet, wherein one of repulsive magnetic force and attractive magnetic force is applied between the first driving magnet and the first driven magnet, and the other of the repulsive magnetic force and the attractive magnetic force is applied between the first driving magnet and the second driven magnet.

In some embodiments, one of repulsive magnetic force and attractive magnetic force may be applied between the second driving magnet and the second driven magnet, and the other of the repulsive magnetic force and the attractive magnetic force may be applied between the second driving magnet and the first driven magnet. The first and second driving magnets may be respectively lower than the first and second driven magnets, the first driven magnet and the first driving magnet may have identical poles facing each other, the second driven magnet and the second driving magnet may have identical poles facing each other, and an upper surface of the first driving magnet and an upper surface of the second driving magnet may have opposite poles to each other.

In other embodiments, the first driving magnet and the second driving magnet may respectively have ring shapes, and the first driving magnet may have a greater diameter than that of the second driving magnet, and surround the second driving magnet.

In still other embodiments, the first rod may be coupled with an elastic member rotating the first rod to apply force to the first pin from the waiting position to the supporting position, and the second rod may be coupled with an elastic member rotating the second rod to apply force to the second pin from the waiting position to the supporting position.

In even other embodiments, the first and second rods each may include: a first part that is a region coupled with the chuck pin with respect to the pivot pin; and a second part that is an opposite region to the first part with respect to the pivot pin, wherein the second part includes: a first line portion; a second line portion that is parallel to the first line portion and is lower than the first line portion; and a third line portion connecting the first ling portion to the second line portion.

In yet other embodiments, when the body rotates, the first and second rods each may use reverse centrifugal force to apply force to the first or second pin from the waiting position to the supporting position.

In still other embodiments of the present disclosure, methods of supporting a lateral portion of a substrate using chuck pins provided to a spin head include rotating a rotation rod to vary heights of both ends of the rotation rod coupled with the chuck pin and to move the chuck pins between supporting positions where the chuck pins are in contact with the lateral portion of the substrate and the waiting positions where the chuck pins are spaced apart from the lateral portion of the substrate, wherein, when the substrate is rotated, a force maintaining the chuck pins at the supporting positions includes a reverse centrifugal force.

In some embodiments, a force moving the chuck pins from the supporting positions to the waiting positions may include a magnetic force. A force moving the chuck pins from the waiting positions to the supporting positions may include an elastic force. A force moving the chuck pins from the waiting positions to the supporting positions may include gravity.

In other embodiments, a driven magnet may be installed at the rotation rod, a driving magnet may be disposed under the driven magnet, the driven magnet and the driving magnet may have identical poles facing each other, the chuck pin may move from the supporting position to the waiting position by moving the driving magnet to the driven magnet, the chuck pin may move from the waiting position to the supporting position by moving the driving magnet away from the driven magnet, and a speed at which the driving magnet moves away from the driven magnet may be less than a speed at which the driving magnet moves to the driven magnet.

In even other embodiments of the present disclosure, substrate treating apparatuses include: a housing; a spin head disposed in the housing and supporting a substrate; and a fluid supplying unit supplying process solution or process gas onto the substrate placed on the spin head, where the spin head includes: a body; chuck pins protruding upward from the body; and a chuck pin moving unit configured to move the chuck pins between supporting positions where a lateral portion of the substrate placed on the spin head is supported and waiting positions that are farther from a center of the body than the supporting positions are so as to allow the substrate to be placed on the body, wherein the chuck pin moving unit includes: a rotation rod fixed to the body through a pivot pin, the rotation rod having a first part that is a region coupled with the chuck pin with respect to the pivot pin, the rotation rod having a second part that is an opposite region to the first part with respect to the pivot pin; and a driving member configured to rotate the rotation rod to vary heights of both ends of the rotation rod and to move the chuck pin between the supporting position and the waiting position.

In some embodiments, the second part of the rotation rod may include: a first line portion; a second line portion that is farther from the first part than the first line portion is and is lower than the first line portion.

In other embodiments, one part of the chuck pins may be classified into a first group, and the other part of the chuck pins may be classified into a second group, wherein the rotation rods includes: first rods coupled with the chuck pins constituting the first group; and second rods coupled with the chuck pins constituting the second group, wherein the driving member includes: first driven magnets connected to the first rods; second driven magnets closer to the center of the body than the first driven magnets are and connected to the second rods; a first driving magnet facing the first driven magnets; and a second driving magnet facing the second driven magnets.

The first and second driving magnets may be respectively lower than the first and second driven magnets and have ring shapes, the first driven magnet and the first driving magnet may have identical poles facing each other, the second driven magnet and the second driving magnet may have identical poles facing each other, and an upper surface of the first driving magnet and an upper surface of the second driving magnet may have opposite poles to each other.

BRIEF DESCRIPTION OF THE FIGURES

The accompanying figures are included to provide a further understanding of the present disclosure, and are incorporated in and constitute a part of this specification. The drawings illustrate exemplary embodiments of the present disclosure and, together with the description, serve to explain principles of the present disclosure. In the figures:

FIGS. 28 and 29 are a plan view and a cross-sectional view illustrating the spin head of the embodiment of FIG. 18 when a substrate is supported only by second pins.

DETAILED DESCRIPTION OF EMBODIMENTS

Figure 1:
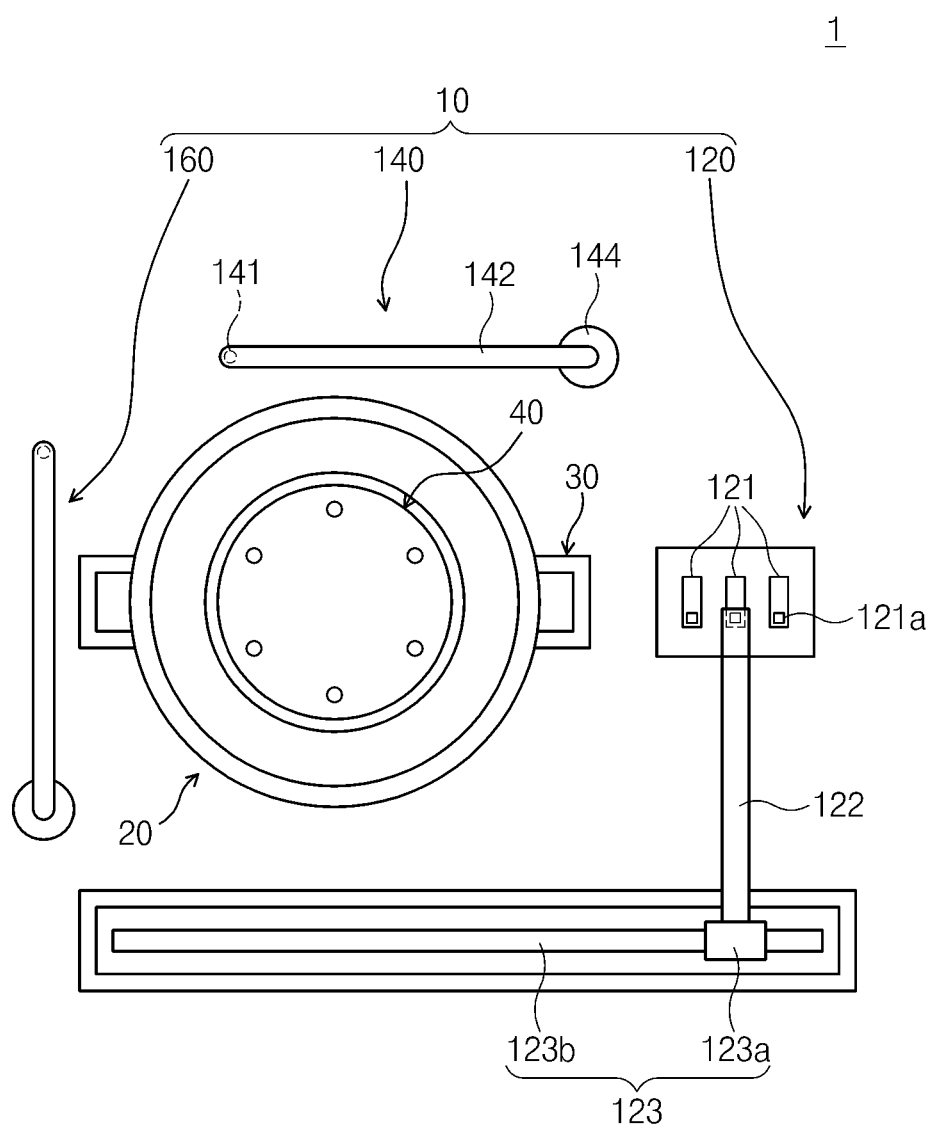
FIG. 1 is a plan view illustrating a substrate treating apparatus according to an embodiment of the present disclosure.

Embodiments of the present disclosure will be described below in more detail with reference to the accompanying drawings. The present disclosure may, however, be embodied in different forms and should not be constructed as limited to the embodiments set forth herein. Rather, these embodiments are provided so that this disclosure will be thorough and complete, and will fully convey the scope of the present disclosure to those skilled in the art. Thus, the shapes of elements are exaggerated for clarity in the drawings.

An apparatus, cleaning a substrate W with chemical solution, rinse solution, and dry gas, will now be described according to an embodiment of present disclosure. However, the spirit and scope of the present disclosure is not limited thereto, and thus, a spin head according to an embodiment of the present disclosure may be applied to various devices rotating the substrate W to perform a process, such as an etch process.

FIG. 1 is a plan view illustrating a substrate treating apparatus 1 according to the current embodiment. Referring to FIG. 1, the substrate treating apparatus 1 includes a fluid supplying unit 10, a container 20, an elevating unit 30, and a spin head 40. The fluid supplying unit 10 supplies process solution or gas for processing a substrate to the substrate W. The spin head 40 supports and rotates the substrate W during a process. The container 20 prevents chemical solution used in the process and fume generated in the process from being splashed or discharged to the outside. The elevating unit 30 moves the spin head 40 or the container 20 up and down and varies a relative height between the container 20 and the spin head 40 in the container 20.

[Fluid Supplying Unit]

Referring to FIG. 1, the fluid supplying unit 10 supplies process solution or gas to the upper surface of the substrate W placed on the spin head 40. The fluid supplying unit 10 includes a chemical solution supplying nozzle 120, a rinse solution supplying nozzle 140, and a dry gas supplying nozzle 160. The chemical solution supplying nozzle 120 supplies a plurality of types of chemical solution to the substrate W. The chemical solution supplying nozzle 120 includes a plurality of injectors 121, a support bar 122, and a bar moving device 123. The injectors 121 are disposed on a side of the container 20. The injectors 121 are respectively connected to chemical solution storages (not shown) to receive chemical solution from the chemical solution storages that store different types of solution from each other. The injectors 121 are parallel to each other in a predetermined direction. Each of the injectors 121 includes a protrusion 121a protruding upward. A side surface of the protrusion 121a may be provided with a recess (not shown). Chemical solution may be one of sulfuric acid, nitric acid, ammonia, fluoric acid, and a mixture thereof with deionized water. An end of each of the injectors 121 is provided with a discharging hole (not shown).

The support bar 122 is coupled to one of the injectors 121 to move the injector 121 to the upper portion of the substrate W placed on the spin head 40. The support bar 122 has a long rod shape. The longitudinal direction of the support bar 122 is perpendicular to a direction in which the injectors 121 are arrayed. The lower surface of the support bar 122 is provided with a holder (not shown) for coupling to the injector 121. The holder includes arms (not shown) that are insertable into the recess disposed in the protrusion 121a of the injector 121. The arms may be rotatable or movable from the outside of the protrusion 121a to the recess of the protrusion 121a.

The bar moving device 123 moves the support bar 122 in a straight line between an upper position of the substrate W placed on the spin head 40 and upper positions of the injectors 121. The bar moving device 123 includes a bracket 123a, a guide rail 123b, and a driver (not shown). The guide rail 123b passes by the injectors 121 and the container 20 from the outside of the injectors 121, and extends in a straight line to the outside of the container 20. The bracket 123a is coupled to the guide rail 123b to move along the guide rail 123b. The support bar 122 is fixed to the bracket 123a. The driver provides driving force that moves the bracket 123a in a straight line. An assembly including a motor and a screw may move the bracket 123a in a straight line. Alternatively, an assembly including a belt, a pulley, and a motor may move the bracket 123a in a straight line. Alternatively, a linear motor may move the bracket 123a in a straight line.

The rinse solution supplying nozzle 140 is disposed on another side of the container 20, and the dry gas supplying nozzle 160 is disposed on another side of the container 20. The rinse solution supplying nozzle 140 includes an injector 141, a support bar 142, and a driver 144. The injector 141 is fixed to an end of the support bar 142. A rotation shaft (not shown) rotated by the driver 144 is fixed to the other end of the support bar 142. The injector 141 receives rinse solution from a rinse solution storage (not shown). The dry gas supplying nozzle 160 approximately has the similar structure to that of the rinse solution supplying nozzle 140. The dry gas supplying nozzle 160 supplies isopropyl alcohol and nitrogen gas that may be heated.

[Container]

Figure 2:
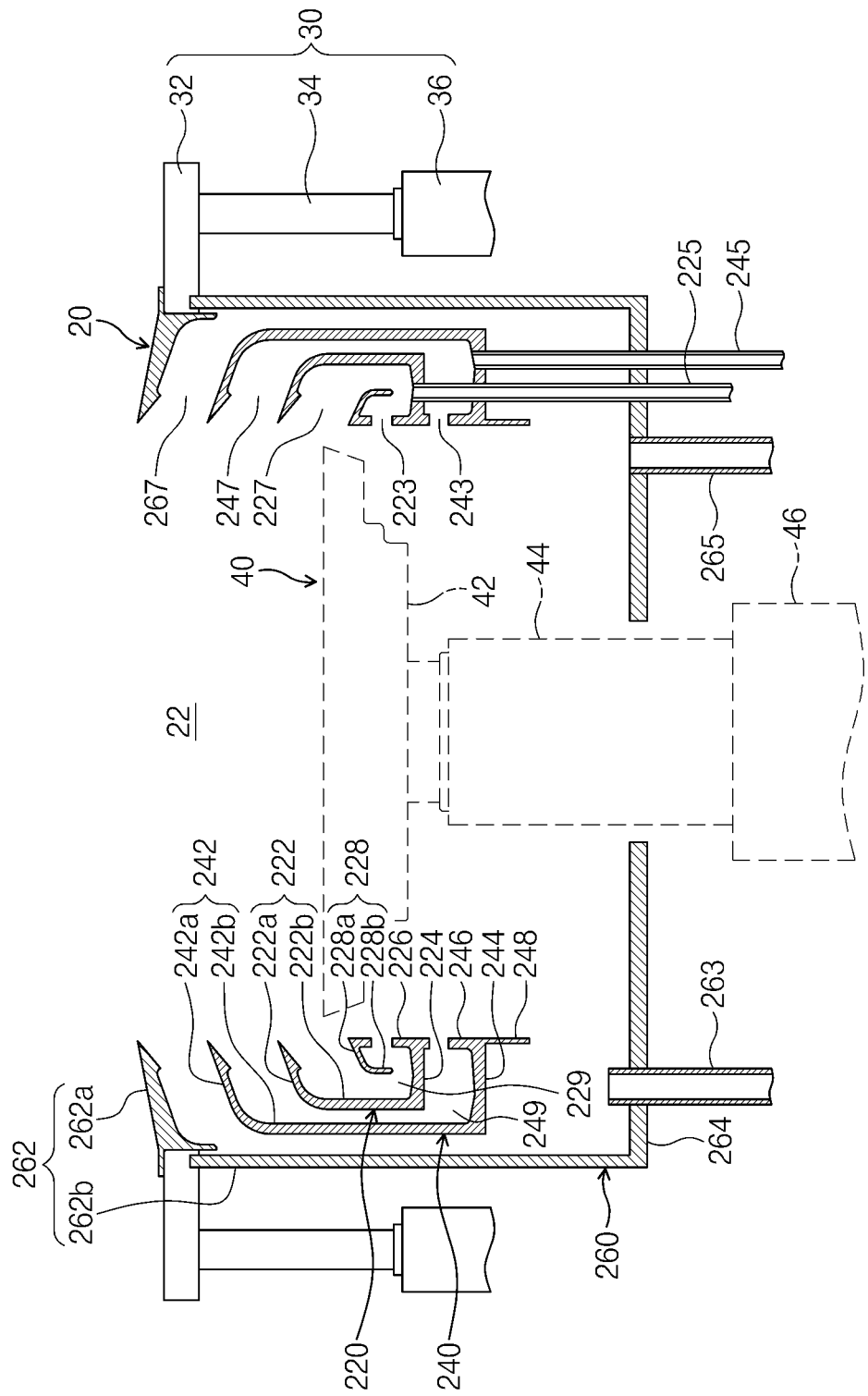
FIG. 2 is a cross-sectional view illustrating a container according to an embodiment of the present disclosure.
Figure 3:
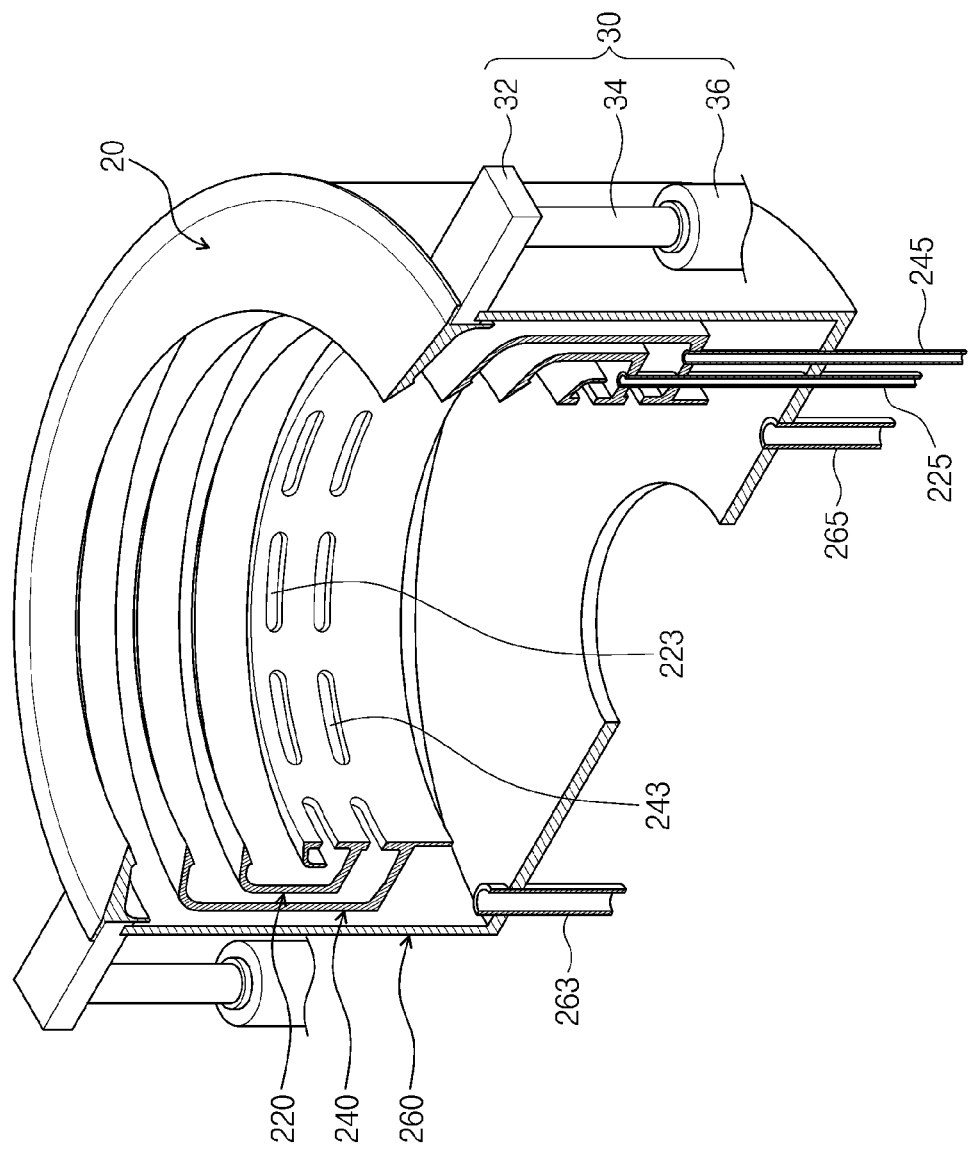
FIG. 3 is a vertical cut-away perspective view illustrating the container of FIG. 2.

FIG. 2 is a cross-sectional view illustrating the container 20. FIG. 3 is a vertical cut-away perspective view illustrating the container 20. Referring to FIGS. 2 and 3, the container 20 has an open upper portion and an inner space 22 in which the substrate W is processed. A body 42 of the spin head 40 is disposed in the inner space 22. A rotation shaft 44 of the spin head 40 protrudes out of the container 20 from the body 42 through an opening in the bottom of the container 20. A driver 46 such as a motor is fixed to the rotation shaft 44 to supply torque to the rotation shaft 44.

The container 20 is configured to separate and collect chemical solutions used in a process, thus reusing the chemical solutions. The container 20 includes a plurality of collecting vessels 220, 240, and 260 that collect different types of process liquid used in the process, respectively. The collecting vessels 220, 240, and 260, described according to the current embodiment, may be referred to as an inner collecting vessel, a middle collecting vessel, and an outer collecting vessel, respectively.

The inner collecting vessel 220 has a ring shape surrounding the spin head 40, and the outer collecting vessel 260 has a ring shape surrounding the middle collecting vessel 240. The inner collecting vessel 220, the middle collecting vessel 240, and the outer collecting vessel 260 respectively have introduction openings 227, 247, and 267 that communicate with the inner space 33 of the container 20. Each of the introduction openings 227, 247, and 267 has a ring shape around the spin head 40. Centrifugal force generated by the rotation of the substrate W introduces chemical solutions, injected to the substrate W in the process, into the collecting vessels 220, 240, and 260 through the introduction openings 227, 247, and 267. The introduction opening 267 of the outer collecting vessel 260 is disposed on the vertical upper side of the introduction opening 247 of the middle collecting vessel 240, and the introduction opening 247 of the middle collecting vessel 240 is disposed on the vertical upper side of the introduction opening 227 of the inner collecting vessel 220. That is, the introduction opening 227 of the inner collecting vessel 220, the introduction opening 247 of the middle collecting vessel 240, and the introduction opening 267 of the outer collecting vessel 260 have different heights from each other.

The inner collecting vessel 220 includes an outer wall 222, a bottom wall 224, an inner wall 226, and a guide wall 228 that have ring shapes, respectively. The outer wall 222 includes an inclined wall 222a inclined downward in a direction distant from the spin head 40, and a vertical wall 222b vertically extending downward from the lower end of the inclined wall 222a. The bottom wall 224 horizontally extends from the lower end of the vertical wall 222b to the spin head 40. An end of the bottom wall 224 extends to a vertical line on which the upper end the inclined wall 222a is disposed. The upper end of the inner wall 226 extends to a position that is spaced a predetermined distance from the upper end of the inclined wall 222a. A vertical space between the inner wall 226 and the inclined wall 222a functions as the introduction opening 227 of the inner collecting vessel 220.

The inner wall 226 is provided with a plurality of openings 223 arrayed in a ring shape. Each of the openings 223 has a slit shape. The openings 223 function as exhausting holes that discharge gases, introduced into the inner collecting vessel 220, to the outside through the lower space in the spin head 40. Process solution introduced through the inner collecting vessel 220 is discharged through a discharging pipe 225 to an external system for recycling chemical solution.

The guide wall 228 includes an inclined wall 228a inclined downward in the direction distant from the spin head 40 from the upper end of the inner wall 226, and a vertical wall 228b vertically extending downward from the lower end of the inclined wall 228a. The lower end of the vertical wall 228b is spaced a predetermined distance from the bottom wall 224. The guide wall 228 guides process liquid, introduced through the introduction opening 227, to a space 229 defined by the outer wall 222, the bottom wall 224, and the inner wall 226, so that the process liquid efficiently flows to the space 229.

The middle collecting vessel 240 includes an outer wall 242, a bottom wall 244, an inner wall 246, and a protruding wall 248. The outer wall 242, the bottom wall 244, and the inner wall 246 of the middle collecting vessel 240 are approximately similar to the outer wall 222, the bottom wall 224, and the inner wall 226 of the inner collecting vessel 220, but the middle collecting vessel 240 is larger than the inner collecting vessel 220 such that the middle collecting vessel 240 surrounds the inner collecting vessel 220. A vertical space is disposed between the upper end of an inclined wall 242a constituting the outer wall 242 of the middle collecting vessel 240 and the upper end of the inclined wall 222a constituting the outer wall 222 of the inner collecting vessel 220. The vertical space functions as the introduction opening 247 of the middle collecting vessel 240. The protruding wall 248 vertically extends downward from the end of the bottom wall 244. The upper end of the inner wall 246 of the middle collecting vessel 240 is in contact with the end of the bottom wall 224 of the inner collecting vessel 220. Slit-shaped exhausting holes 243 for discharging gas are arrayed in a ring shape in the inner wall 246 of the middle collecting vessel 240. A discharging pipe 245 is coupled to the bottom wall 244. Process solution introduced through the middle collecting vessel 240 is discharged through the discharging pipe 245 to the external system for recycling chemical solution.

The outer collecting vessel 260 includes an outer wall 262 and a bottom wall 264. The outer wall 262 of the outer collecting vessel 260 is similar in shape to the outer wall 242 of the middle collecting vessel 240, but the outer collecting vessel 260 is larger than the middle collecting vessel 240 such that the outer collecting vessel 260 surrounds the middle collecting vessel 240. A vertical space is disposed between the upper end of an inclined wall 262a constituting the outer wall 262 of the outer collecting vessel 260 and the upper end of the inclined wall 242a constituting the outer wall 242 of the middle collecting vessel 240. The vertical space functions as the introduction opening 267 of the outer collecting vessel 260. The bottom wall 264 has an approximate circular plate shape, and the opening to which the rotation shaft 44 is inserted is disposed in the center of the bottom wall 264. A discharging pipe 265 is coupled to the bottom wall 264. Process solution introduced through the outer collecting vessel 260 is discharged through the discharging pipe 265 to the external system for recycling chemical solution. The outer collecting vessel 260 functions as the whole outer wall of the container 20. An exhausting pipe 263 is coupled to the bottom wall 264 of the outer collecting vessel 260. Gas introduced into the outer collecting vessel 260 is exhausted through the exhausting pipe 263 to the outside. Gas, discharged through the openings 223 provided to the inner wall 246 of the inner collecting vessel 220 and the exhausting holes 243 provided to the inner wall 246 of the middle collecting vessel 240, is exhausted to the outside through the exhausting pipe 263 connected to the outer collecting vessel 260. The exhausting pipe 263 protrudes with a predetermined length upward from the bottom wall 264.

In the current embodiment, the container includes the collecting vessels configured to separate and collect process solutions. However, a container may include only a single collecting vessel without an inner collecting vessel and a middle collecting vessel.

[Elevating Unit]

Referring to FIGS. 2 and 3, the elevating unit 30 moves the container 20 up and down along a straight line. As the container 20 moves up and down, the relative height of the container 20 to the spin head 40 is varied. The elevating unit 30 includes a bracket 32, a moving shaft 34, and a driver 36. The bracket 32 is fixed to the outer wall of the container 20, and the moving shaft 34 moved up and down by the driver 36 is fixed to the bracket 32. The container 20 is moved downward to expose the spin head 40 upward out of the container 20 when the substrate W is loaded on the spin head 40 or unloaded from the spin head 40. When the process is performed, the height of the container 20 is adjusted according to the type of process liquid supplied to the substrate W, so as to introduce the process liquid to a preset one of the collecting vessels 220, 240, and 260. On the contrary, the elevating unit 30 may move the spin head 40 up and down.

Spin Head

One Embodiment

Figure 4:
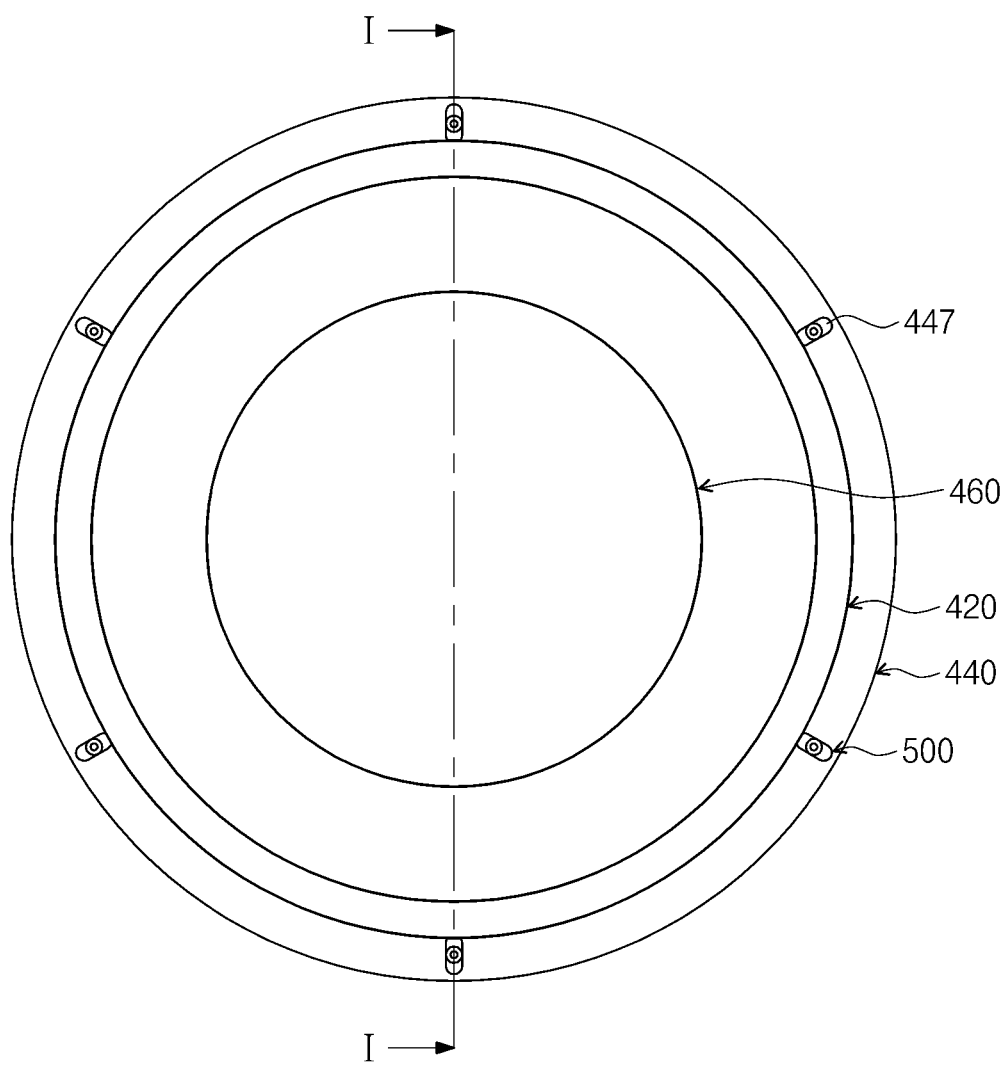
FIG. 4 is a plan view illustrating a spin head according to an embodiment of the present disclosure.
Figure 5:
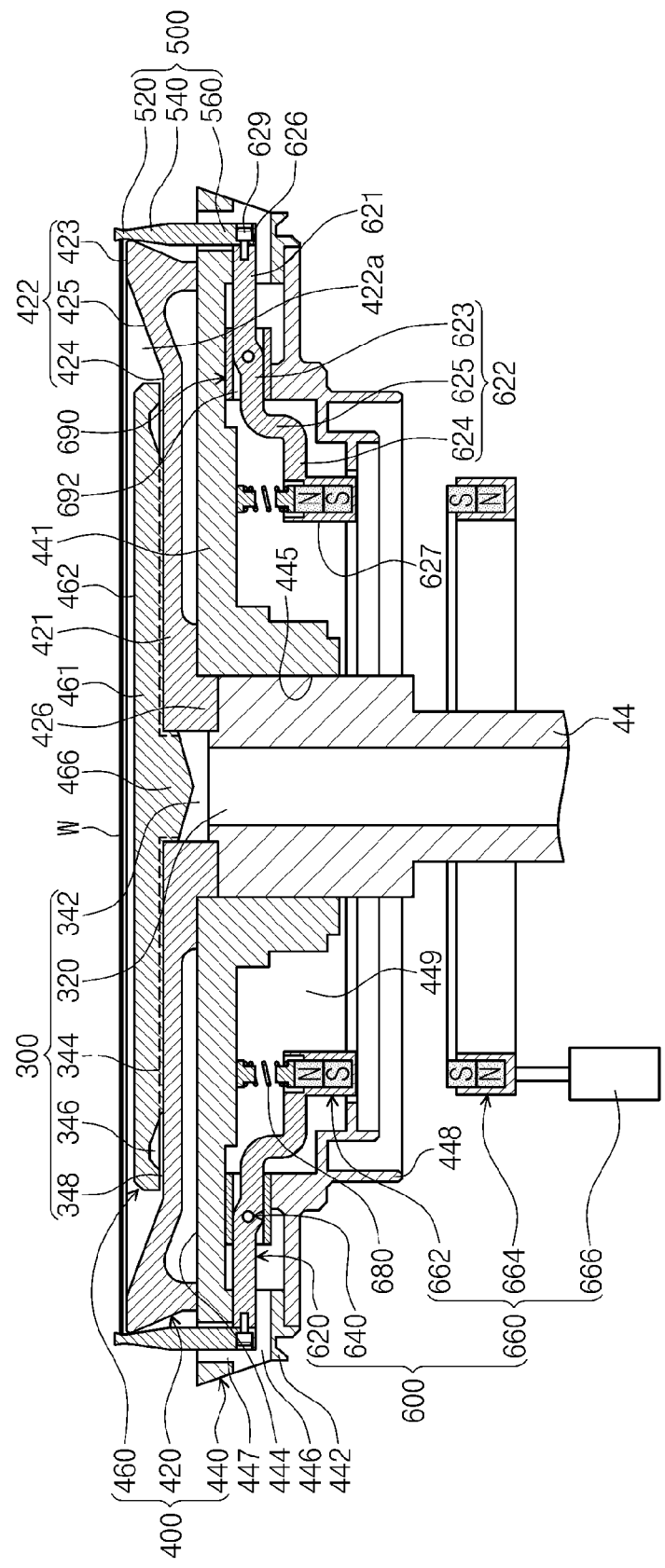
FIG. 5 is a cross-sectional view taken along line I-I of FIG. 4.

Hereinafter, the structure of the spin head 40 will now be described with reference to FIGS. 4 and 5. FIG. 4 is a plan view illustrating the spin head 40. FIG. 5 is a cross-sectional view taken along line I-I of FIG. 4. The spin head 40 includes a gas supplying member 300, a body 400, chuck pins 500, and a chuck pin moving unit 600.

Referring to FIGS. 4 and 5, the body 400 includes an upper plate 420, a lower plate 440, and a guide plate 460. The upper plate 420, the lower plate 440, and the guide plate 460 are fixed to each other through screws (not shown). The upper plate 420 includes a support 421 and an insert 426. The support 421 has an upper surface 422 having an approximately circular shape at a top view. An edge portion 423 of the upper surface 422 of the support 421 has a horizontal surface. A center portion 424 is lower than the edge portion 423, and has a horizontal surface. A connection portion 425 is disposed between the edge portion 423 and the center portion 424, and is inclined downward from the edge portion 423 to the center portion 424. Because of this shape, the support 421 has a concave space 422a on the upper surface 422. The insert 426 extends downward from the center region of the lower surface of the support 421. The insert 426 is configured to stably place the upper plate 420 at a desired position on the lower plate 440 when the upper plate 420 is coupled to the lower plate 440. The upper plate 420 is provided with a through hole 342 vertically passing through the support 421 and the insert 426.

The guide plate 460 includes an upper body 461 and an insert 466. The upper body 461 has an upper surface 462 having an approximately circular shape at a top view. The upper body 461 has a diameter slightly less than the center portion 424 of the support 421 of the upper plate 420. The upper surface 462 of the upper body 461 of the guide plate 460 is lower than the edge portion 423 of the support 421 of the upper plate 420. The insert 466 protrudes downward from the center region of the bottom surface of the upper body 461. The insert 466 is inserted into the through hole 342 disposed in the upper plate 420, and the upper body 461 is disposed in the space 422a provided to the upper surface 422 of the upper plate 420. The bottom surface of the guide plate 460 is provided with a conduit where gas, supplied through the through hole 342 of the upper plate 420 and a through hole 445 of the lower plate 440, flows. The edge of the bottom surface of the guide plate 460 is provided with a ring-shaped concave buffer space 346. The bottom surface of the guide plate 460 is provided with a ring-shaped concave 348 extending from the buffer space 346 to the outer end of the guide plate 460. The concave 348 is provided as a gap between the guide plate 460 and the upper plate 420, and functions as a passage through which gas is discharged from the buffer space 346 to the outside. While the bottom surface of the guide plate 460 approximately contacts the upper surface 422 of the support 421 of the upper plate 420, the bottom surface of the guide plate 460 is provided with a plurality of passages 344 connecting the through hole 342 provided to the upper plate 420 to the buffer space 346.

The lower plate 440 is disposed under the upper plate 420, and supports the upper plate 420. The lower plate 440 includes a support 441 and a lower cover 448. The support 441 has an upper surface 444 having an approximately circular shape at a top view. The upper surface 444 of the support 441 of the lower plate 440 has a greater diameter than the center portion 424 than the upper surface 422 of the support 421 of the upper plate 420. The upper surface 422 of the support 421 of the upper plate 420 is slightly smaller than the substrate W, and the upper surface 444 of the support 441 of the lower plate 440 is larger than the substrate W. The upper surface 444 of the support 441 of the lower plate 440 is a horizontal surface as a whole. The through hole 445 vertically passes through the center of the lower plate 440. The length of the through hole 445 of the lower plate 440 is greater than that of the insert 426 of the upper plate 420. The size of the through hole 445 of the lower plate 440 corresponds to the size of the insert 426 of the upper plate 420. The upper plate 420 is inserted downward from the upper side such that the insert 426 is inserted into the through hole 445 of the lower plate 440.

The support 441 includes an outer wall 442 protruding downward in a ring shape along the edge of the support 441. The outer wall 442 is provided with through holes 446 extending from the inner surface of the outer wall 442 to the outer surface thereof. The edge of the support 441 is provided with pin holes 447 extending from the through holes 446 to the upper surface 444 of the support 441. The through holes 446 and the pin holes 447 are provided as spaces for positioning portions of the chuck pin moving unit 600 and the chuck pins 500 and assembling the chuck pin moving unit 600 and the chuck pins 500. The pin holes 447 guide the moving of the chuck pins 500 between waiting position and supporting positions which will be described later. The pin holes 447 have slip shapes. The longitudinal direction of the pin holes 447 is disposed along the radial direction of the lower plate 440. The width of the pin hole 447 is equal to or slightly greater than the diameter of the chuck pins 500. The number of the through holes 446 and the number of the pin holes 447 are equal to the number of the chuck pins 500.

The lower cover 448 has a ring shape having an inner space in which upper and lower portions communicate with each other. The lower cover 448 is fixed to the support 441 of the lower plate 440. A predetermined space 449 is disposed between the support 441 and the lower cover 448. The chuck pin moving unit 600 is disposed in the space 449.

The rotation shaft 44 is inserted upward from the lower side to the through hole 445 of the lower plate 440 and fixed. A gas supplying line 320 vertically extends in the rotation shaft 44, and is connected to an external gas supplying part (not shown). Gas introduced to the gas supplying line 320 through the external gas supplying part flows upward along the gas supplying line 320, and then, flows to the buffer space 346 along the passages 344 provided to the bottom surface of the guide plate 460. Gas flowing out of the concave 348 is distributed upward toward the edge of the substrate W along the connection portion 425 of the upper plate 420, and then, is distributed out of the upper plate 420 through the gap between the substrate W and the edge portion 423 of the upper plate 420. This flow of gas generates gas pressure that spaces the substrate W apart form the upper plate 420, and prevents process solution or gas supplied to the upper portion of the substrate W from being introduced to the rear surface of the substrate W. The gas supplying line 320, the passages 344, the buffer space 346, and the concave 348 are combined to function as the gas supplying member 300.

In the embodiments, the substrate W is supported by the spin head 40 in the state where the substrate W is floated above the spin head 40 by gas pressure. Alternatively, the spin head 40 may include a plurality of support pins (not shown), and the substrate W may be placed on the support pins.

Figure 6:
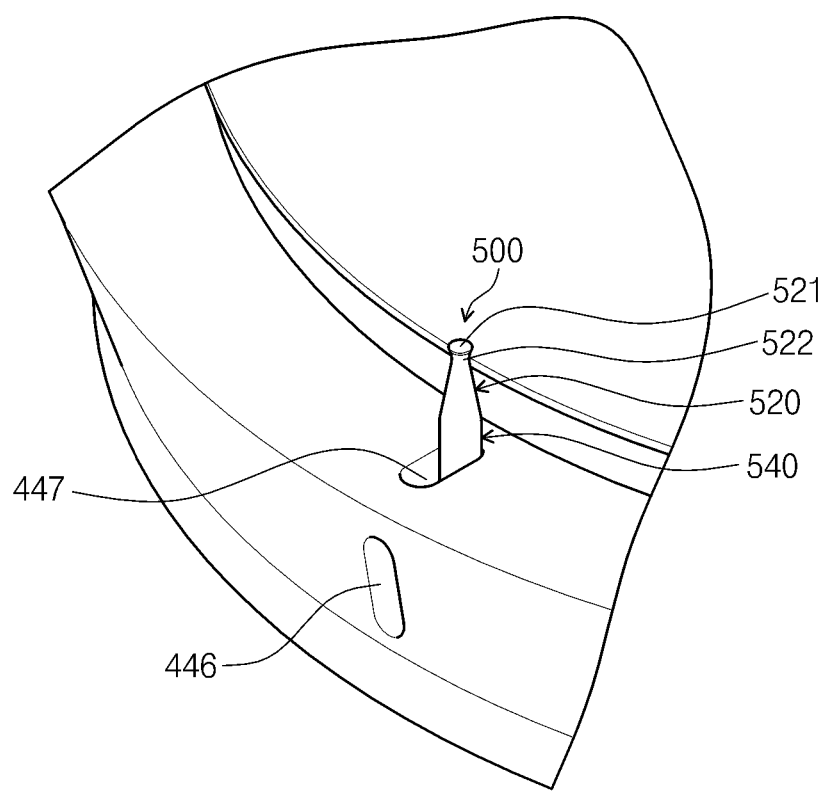
FIG. 6 is an enlarged perspective view illustrating a chuck pin installed at a body of the spin head of FIG. 4.

The chuck pins 500 support the lateral portion of the substrate W to prevent the substrate W from laterally moving out of a desired position when the body 400 rotates. FIG. 6 is an enlarged perspective view illustrating the chuck pin 500 installed at the body 400. Referring to FIGS. 4 through 6, the chuck pins 500 are disposed in the edge region of the lower plate 440 so as to protrude upward from the upper surface 444 of the lower plate 440. The chuck pins 500 have an identical shape and an identical size. The chuck pin 500 includes a support portion 520, a middle portion 540, and a coupling portion 560. The support portion 520 gradually decreases in diameter downward from a flat upper surface 521, and then gradually increases in diameter. Thus, the support portion 520 has a lateral concave portion 522 that is recessed inward at a front view. The support portions 520 of the chuck pins 500 are higher than the edge portion 423 of the upper surface 422 constituting the support 421 of the upper plate 420. The concave portion 522 is in contact with the lateral portion of the substrate W. The middle portion 540 extends downward from the lower end of the support portion 520, and has the diameter of the lower end of the support portion 520. The coupling portion 560 extends downward from the middle portion 540. The coupling portion 560 is provided with a thread hole (not shown) for coupling to the chuck pin moving unit 600.

The chuck pins 500 are configured to move between the supporting positions and the waiting positions. The supporting positions are positions where the chuck pins 500 are in contact with the lateral portion of the substrate W during the process. The waiting positions are positions where the chuck pins 500 provide a space greater than the substrate W to place the substrate W on the spin head 40. Thus, the supporting position is closer to the center of the body 400 than the waiting position. The number of the chuck pins 500 is 5 or greater, and is 6 in the current embodiment.

The chuck pin moving unit 600 moves the chuck pins 500 between the supporting positions and the waiting positions. The chuck pin moving unit 600 includes rotation rods 620, pivot pins 640, driving members 660, and elastic members 680. The number of the rotation rods 620 is equal to the number of the chuck pins 500. Each of the chuck pins 500 is coupled to each of the rotation rods 620. The rotation rod 620 has a longitudinal direction that is disposed along the radial direction of the body 400 at a top view, and disposed in the space 449 of the lower plate 440. An outer end 626 of the rotation rod 620 is disposed in the through hole 446 provided to the outer wall 442 of the lower plate 440. The outer end 626 of the rotation rod 620 is provided with a screw hole, and the chuck pin 500 is coupled to the rotation rod 620 through a screw 629.

The rotation rod 620 is fixed to the body 400 through the pivot pin 640. The pivot pin 640 is disposed in the perpendicular direction to the radial direction of the body 400 at the top view. The rotation rod 620 is rotatable about the pivot pin 640 as a rotation shaft. The body 400 includes a stopper 690 configured to limit a rotation range of the rotation rod 620. The stopper 690 has a cylindrical pipe shape, and has a longitudinal direction that is disposed along the radial direction of the body 400. A through hole 692 passes through the stopper 690. The rotation rod 620 has a thickness less than the diameter of the through hole 692, and passes through the through hole 692 of the stopper 690. The pivot pin 640 fixes the rotation rod 620 to the stopper 690.

The rotation rod 620 includes a first part 621 and a second part 622. The first part 621 is a part coupled with the chuck pin 500, and the second part 622 is an opposite part to the first part 621 with respect to the pivot pin 640. When the first part 621 of the rotation rod 620 moves upward (that is, the second part 622 moves downward), the chuck pin 500 moves to the supporting position. When the first part 621 of the rotation rod 620 moves downward (that is, the second part 622 moves upward), the chuck pin 500 moves to the waiting position. In the rotation rod 620, the second part 622 is heavier than the first part 621. The sum of the weight of the second part 622 of the rotation rod 620 and the weight of a driven magnet 662 that will be described later is greater than the sum of the weight of the first part 621 of the rotation rod 620 and the weight of the chuck pin 500. Thus, when an external force is not applied, the second part 622 is moved downward by gravity, so that the chuck pin 500 is placed at the supporting position. Accordingly, the chuck pins 500 continually contact the lateral portion of the substrate W during a process.

The rotation rod 620 has a shape to apply reverse centrifugal force to the chuck pin 500 toward the center of the substrate W while the body 400 rotates. To this end, the second part 622 has a shape to rotate an inner end 627 of the second part 622 downward in a direction distant from the center of the body 400 when centrifugal force is applied to the second part 622 of the rotation rod 620 along the radial direction of the body 400. In the second part 622 of the rotation rod 620, the inner end 627, which is nearest to the center of the body 400, is lower than a portion adjacent to the first part 621.

For example, the second part 622 of the rotation rod 620 includes a first line portion 623, a second line portion 624, and a third line portion 625. The first line portion 623, the third line portion 625, and the second line portion 624 are sequentially disposed. The first line portion 623 is nearest to the first part 621. The third line portion 625 connects the first line portion 623 to the second line portion 624. A region of the third line portion 625 connected to the first line portion 623 is higher than a region of the third line portion 625 connected to the second line portion 624. For example, the first line portion 623 and the second line portion 624 may respectively have straight line shapes, the first line portion 623 may be parallel to the second line portion 624, and the third line portion 625 may be perpendicular to the first line portion 623 and the second line portion 624. Alternatively, the third line portion 625 may be inclined to gradually decrease in height from the first line portion 623 to the second line portion 624.

The first part 621 includes a line portion continuously extending in an approximately straight line shape from the first line portion 623 of the second part 622. The upper and lower surfaces of the first line portion 623 of the second part 622 may be slightly lower than the upper and lower surfaces of the line portion of the first part 621, respectively.

Alternatively, one of rotation rods having various shapes may be provided.

Figure 7:
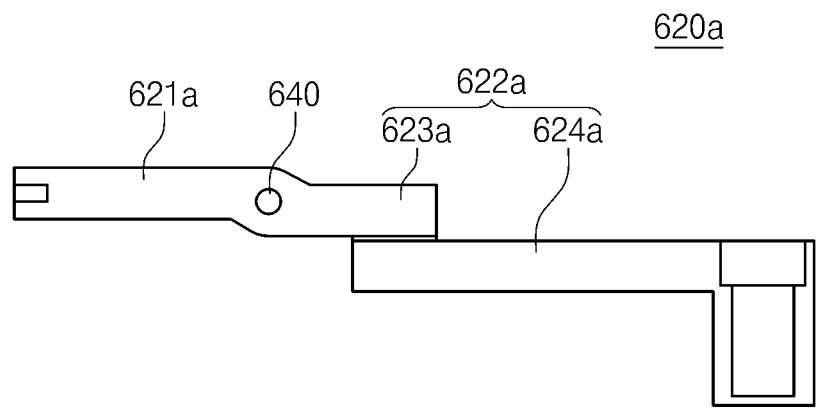
FIGS. 7 and 8 are schematic views illustrating rotation rods according to embodiments of the present disclosure.
Figure 8:
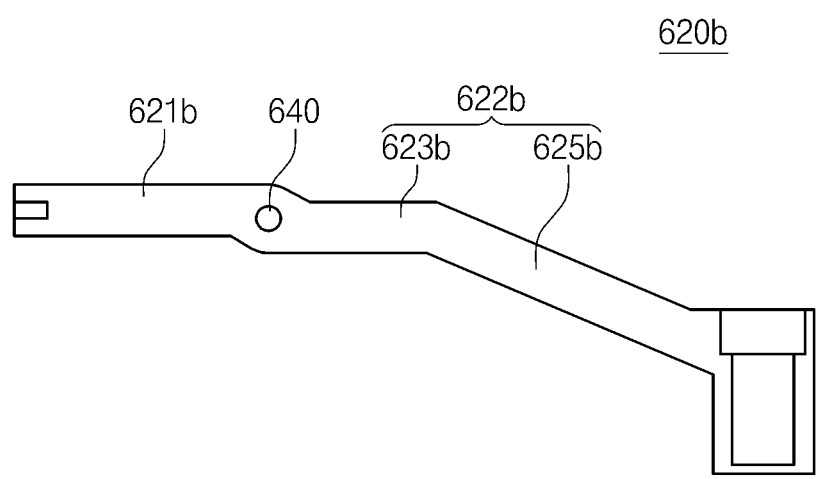

For example, referring to FIG. 7, a rotation rod 620*a* may include a first part 621*a* and a second part 622*a*. The second part 622*a* may include only a first line portion 623*a* and a second line portion 624*a*. A region of the second line portion 624*a* disposed under the first line portion 623*a* may be in contact with a region of the first line portion 623*a*. Alternatively, referring to FIG. 8, a rotation rod 620*b* may include a first part 621*b* and a second part 622*b*. The second part 622*b* may include only a first line portion 623*b* and a third line portion 625*b*. The third line portion 625*b* may be inclined downward in a direction distant from the first line portion 623*b*.

In the case where the rotation rods 620, 620*a*, and 620*b* having the shapes according to the current embodiment are used, when the body 400 is rotated, reverse centrifugal force is applied to the chuck pins 500 toward the center of the substrate W instead of a case where centrifugal force is applied to the chuck pins 500 in the direction distant from the substrate W. Thus, the substrate W can be supported more stably during a process.

When external force is not applied, the elastic members 680 use elastic force to dispose the chuck pins 500 at the supporting positions. The elastic member 680 applies elastic force to the rotation rod 620 to rotate the second line portion 624 of the rotation rod 620 downward and rotate the first line portion 623 upward. Each of the elastic members 680 is coupled to each of the rotation rods 620. For example, the elastic member 680 may be a spring. In this case, the spring (also denoted by 680) is disposed at the upper side of the second line portion 624, and has an end fixed to the body 400 and the other end fixed to the second line portion 624. When being installed, the spring 680 is compressed to provide elastic force for pushing the second line portion 624 downward. Alternatively, the spring 680 may be compressed at the waiting position, and be in equilibrium at the supporting position. Alternatively, the spring 680 may be disposed at the upper side of the first line portion 623, and have an end fixed to the first line portion 623. In this case, the spring 680 may be installed in a stretched state to provide elastic force for pulling the first line portion 623 upward.

The driving members 660 move the chuck pins 500 from the supporting positions to the waiting positions. For example, the driving members 660 use magnetic force to rotate the rotation rods 620 about the pivot pins 640, so that the chuck pins 500 are moved from the supporting positions to the waiting positions. The driving member 660 includes the driven magnet 662, a driving magnet 664, and a driver 666. The driven magnet 662 is fixed to the rotation rod 620. The driving magnet 664 faces the driven magnet 662 under the driven magnet 662. The driven magnet 662 has different poles that are vertically arrayed. The driven magnet 662 is provided in plurality. Each of the driven magnets 662 is installed at each of the rotation rods 620. For example, the driven magnet 662 may be installed at the inner end 627 of the rotation rod 620. The driving magnet 664 has a ring shape to face all the driven magnets 662. The driven magnets 662 and the driving magnet 664 are disposed such that the same poles face each other. Permanent magnets are used as the driven magnets 662 and the driving magnet 664, respectively.

The driver 666 is connected to the driving magnet 664, and may include a cylinder. The driver 666 moves the driving magnet 664 in a straight line between a first position and a second position. The first position is higher than the second position. Repulsion provided to the driven magnets 662 by the driving magnet 664 at the first position is greater than the sum of gravity and elastic force provided to the driven magnets 662. Repulsion provided to the driven magnets 662 by the driving magnet 664 at the second position is less than the sum of gravity and elastic force provided to the driven magnets 662. When the elastic members 680 are not provided, repulsion provided to the driven magnet 662 at the first position is greater than gravity provided to the driven magnets 662, and repulsion provided to the driven magnet 662 at the second position is less than gravity provided to the driven magnets 662. The driver 666 is controlled to slowly move the driving magnet 664 from the first position to the second position. This is because, when the driving magnet 664 rapidly moves from the first position to the second position, elastic force of the elastic members 680 rapidly moves the chuck pins 500 from the waiting positions to the supporting positions so as to damage the substrate W. For example, the speed of the driving magnet 664 when moving in the direction distant from the driven magnet 662 is slower than the speed of the driving magnet 664 when moving to the driven magnet 662.

Alternatively, an electromagnet may be used as the driving magnet 664. In this case, the driving magnet 664 is fixed to the body 400, and the upward move of the driven magnets 662 can be controlled according to whether a current is supplied to a coil provided to the driving magnet 664. In this case, a driver may not be provided. In addition, when an electromagnet is used as the driving magnet 664, the direction of a current applied to a coil of the driving magnet 664 is controlled to respectively control the upward and downward moves of the driven magnet 662. In this case, the elastic members 680 may not be provided.

In the above examples, the driving member moves the chuck pins from the supporting positions to the waiting positions, and elastic force or gravity moves the chuck pins from the waiting positions to the supporting positions. However, on the contrary, the driving member may move the chuck pins from the waiting positions to the supporting positions, and elastic force may move the chuck pins from the supporting positions to the waiting positions.

Figure 9:
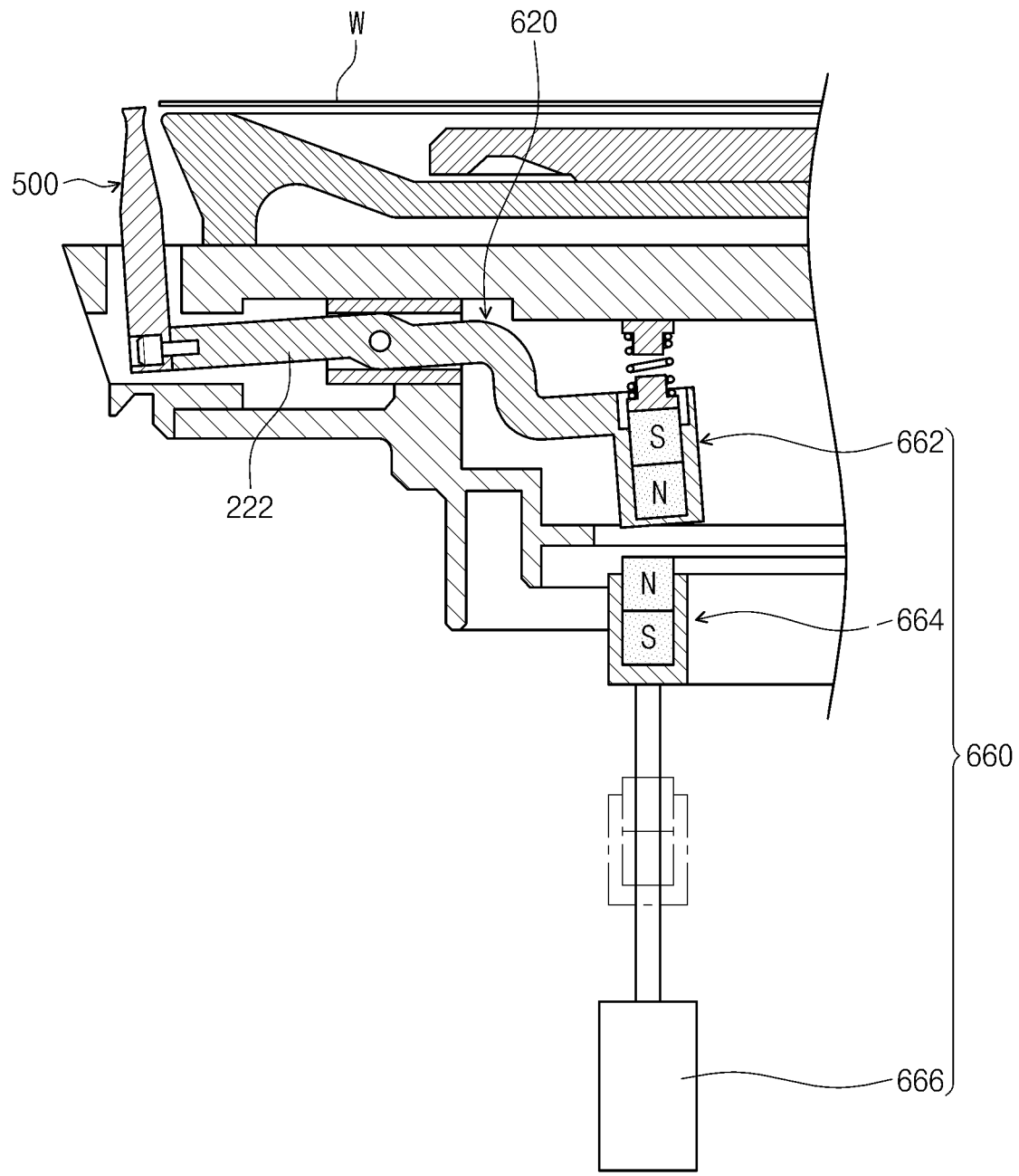
FIGS. 9 and 10 are a cross-sectional view and a plan view illustrating the spin head of FIG. 4 when chuck pins are disposed at waiting positions.
Figure 10:
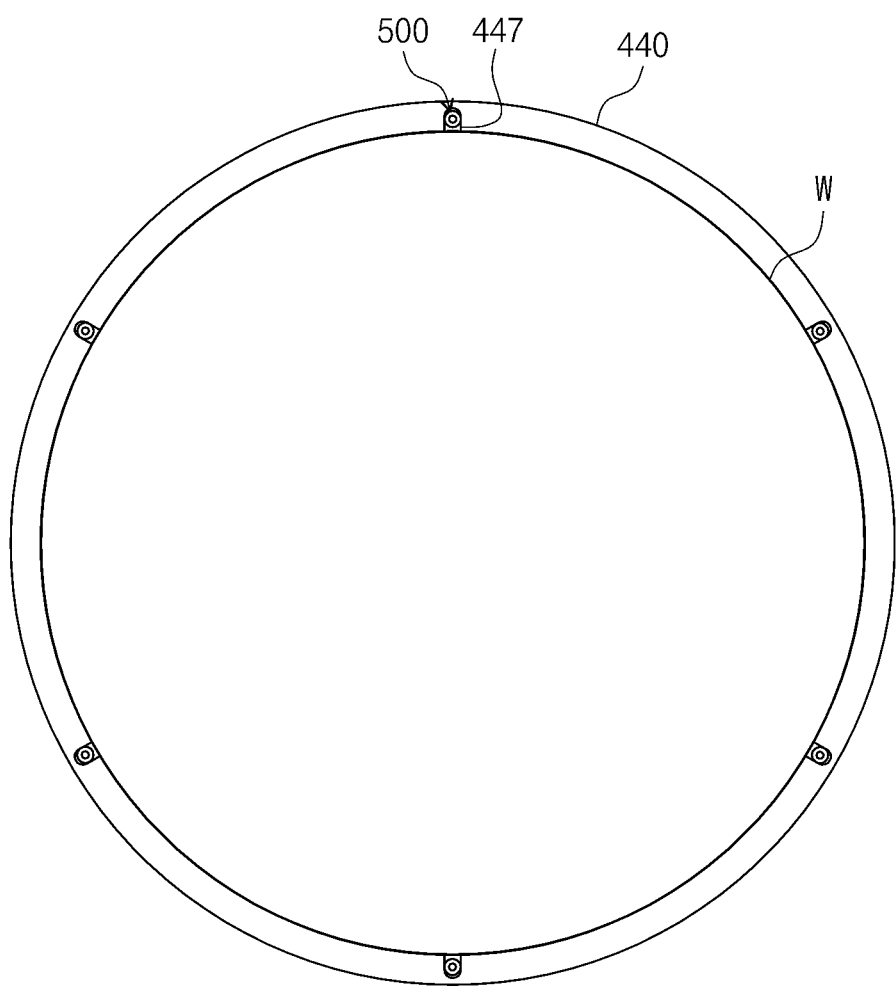
Figure 11:
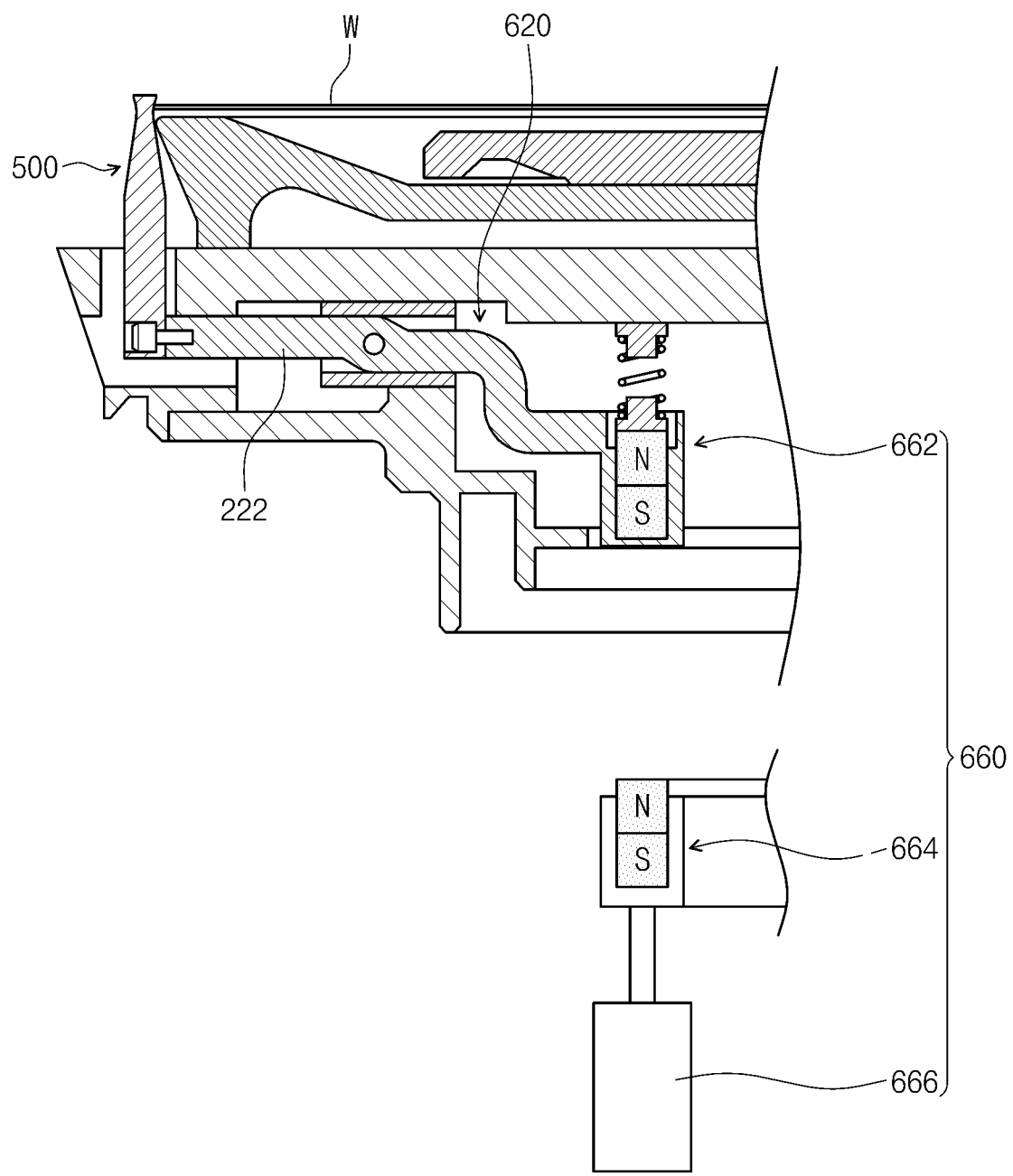
FIGS. 11 and 12 are a cross-sectional view and a plan view illustrating the spin head of FIG. 4 when the chuck pins are disposed at supporting positions.
Figure 12:
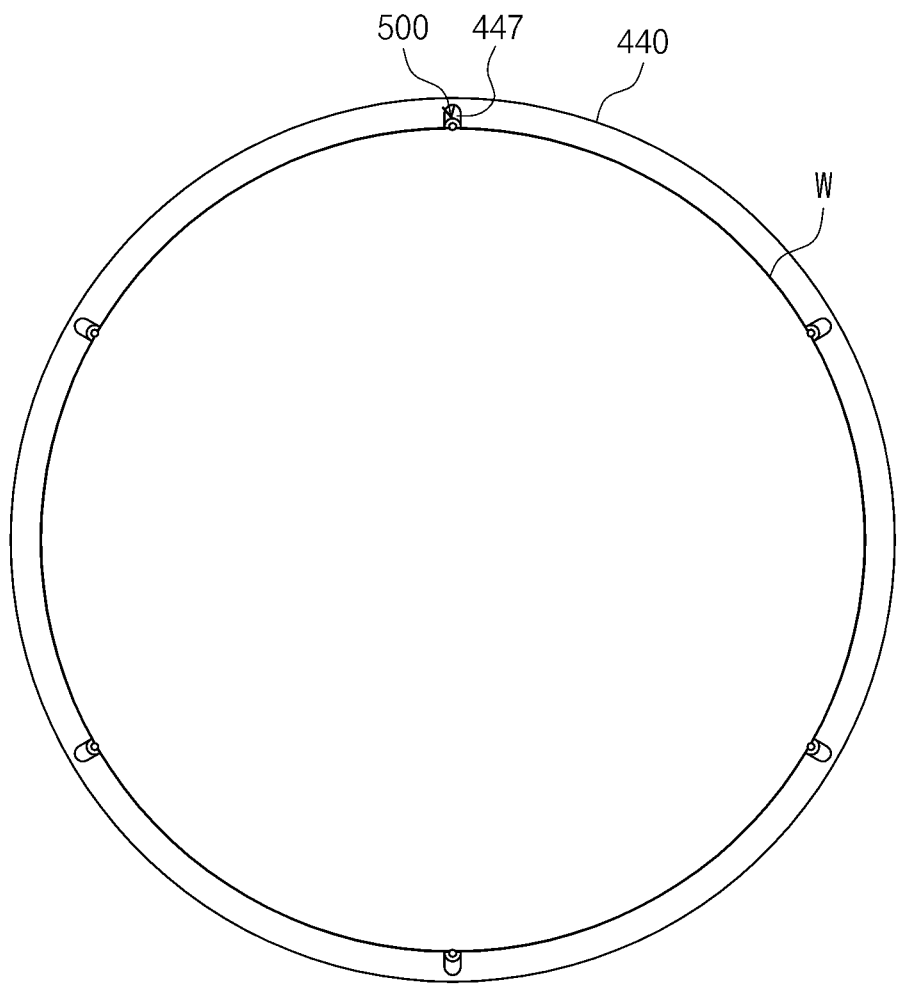

FIGS. 9 through 12 illustrate states where the chuck pins 500 and the chuck pin moving unit 600 are disposed at the supporting positions and the waiting positions. FIGS. 9 and 10 are a cross-sectional view and a plan view illustrating the spin head 40 when the chuck pins 500 are disposed at the waiting positions, and FIGS. 11 and 12 are a cross-sectional view and a plan view illustrating the spin head 40 when the chuck pins 500 are disposed at the supporting positions. Referring to FIGS. 9 and 10, when the substrate W is loaded or unloaded from the spin head 40, the chuck pins 500 are disposed at the waiting positions. The driving magnet 664 is moved from the second position to the first position by an elevator. The rotation rod 620 rotates in the direction in which the second part 622 moves upward, and the chuck pins 500 moves to the waiting positions. Referring to FIGS. 11 and 12, when a process is performed in the state where the substrate W is placed on the spin head 40, the chuck pins 500 are disposed at the supporting positions. The driving magnet 664 is moved from the first position to the second position by the elevator. The rotation rod 620 rotates in the direction in which the second part 622 moves downward, the chuck pins 500 move to the supporting positions.

Figure 13:
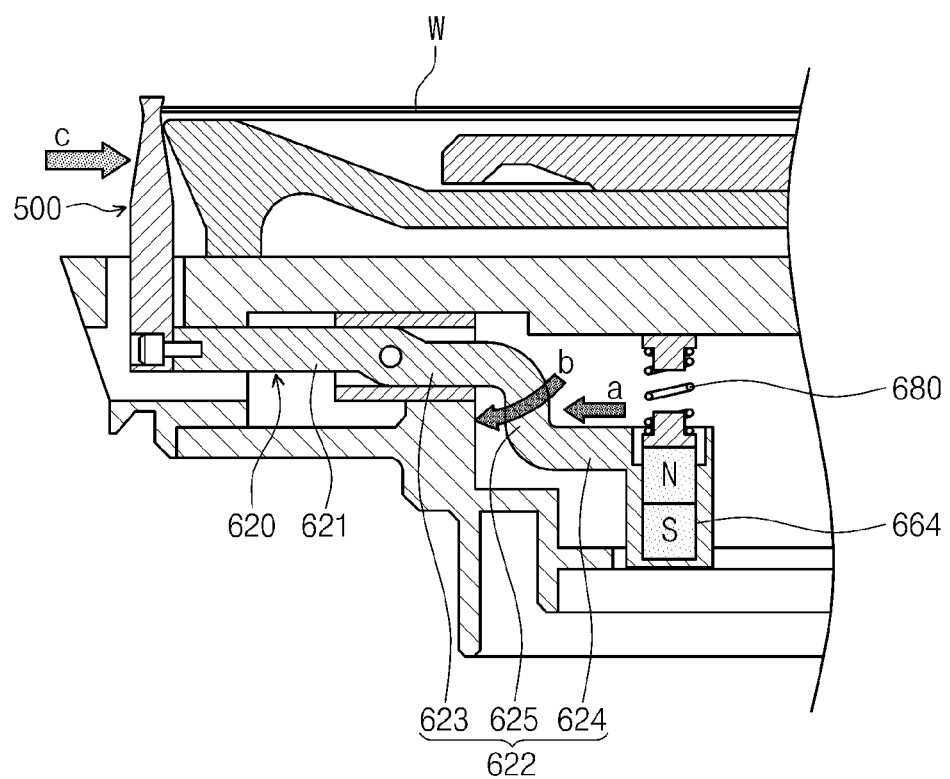
FIG. 13 is a schematic view illustrating a state where reverse centrifugal force is applied to a chuck pin when a substrate rotates, according to an embodiment of the present disclosure.

FIG. 13 is a schematic view illustrating a state where reverse centrifugal force is applied to the chuck pin 500 toward the substrate W rotating during a process. When the body 400 rotates, centrifugal force applies a force 'a' to the second part 622 of the rotation rod 620 from the center of the body 400 to the edge thereof. However, because of the shape of the second part 622 constituting the rotation rod 620, a force 'b' is applied to the rotation rod 620 such that the second part 622 rotates downward. Accordingly, the chuck pin 500 continually provides a force 'c' to the center of the substrate W. That is, when the body 400 rotates, the chuck pins 500 use reverse centrifugal force to continually provide a force to the center of the substrate W instead of being moved in the direction distant from the substrate W by centrifugal force, so as to stably support the substrate W.

Spin Head

Another Embodiment

Figure 14:
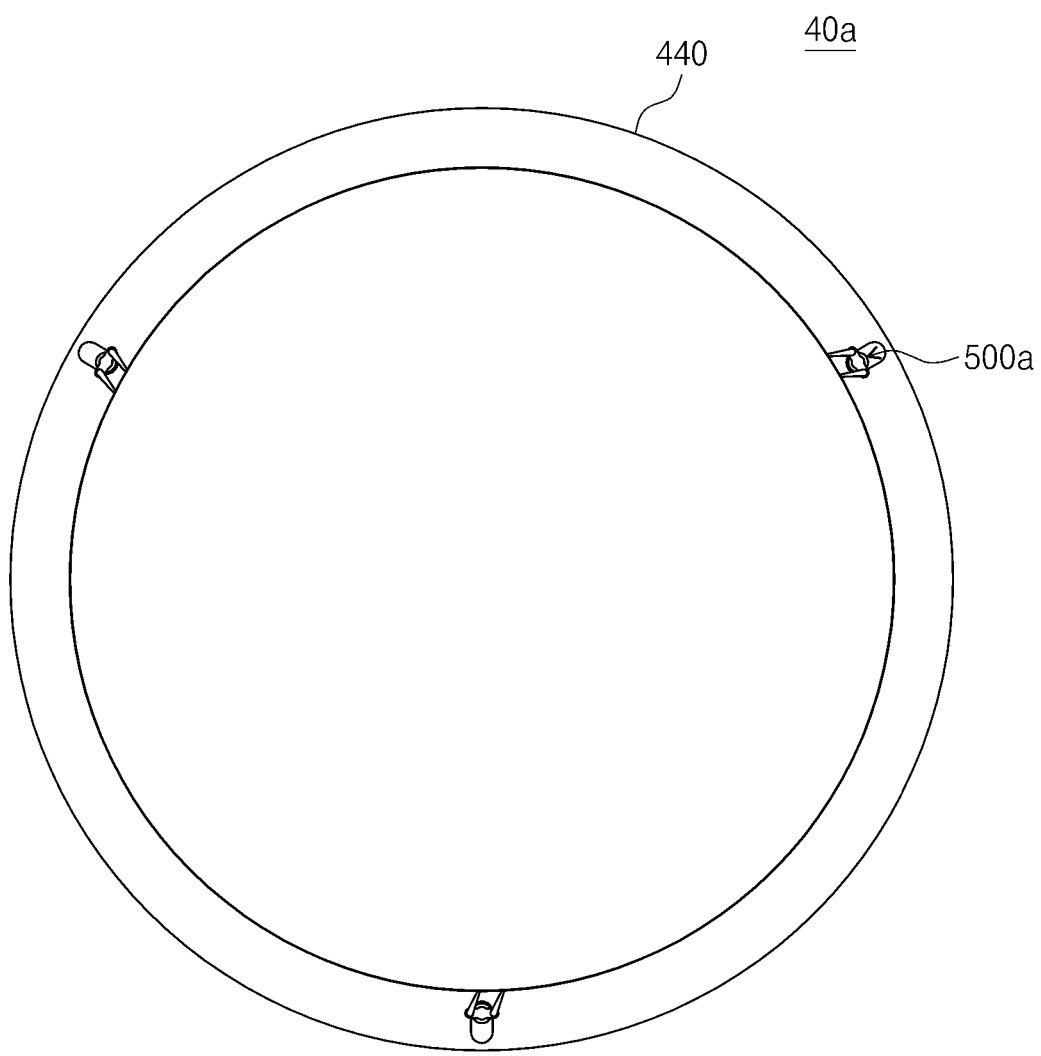
FIG. 14 is a plan view illustrating a spin head according to another embodiment of the present disclosure.
Figure 15:
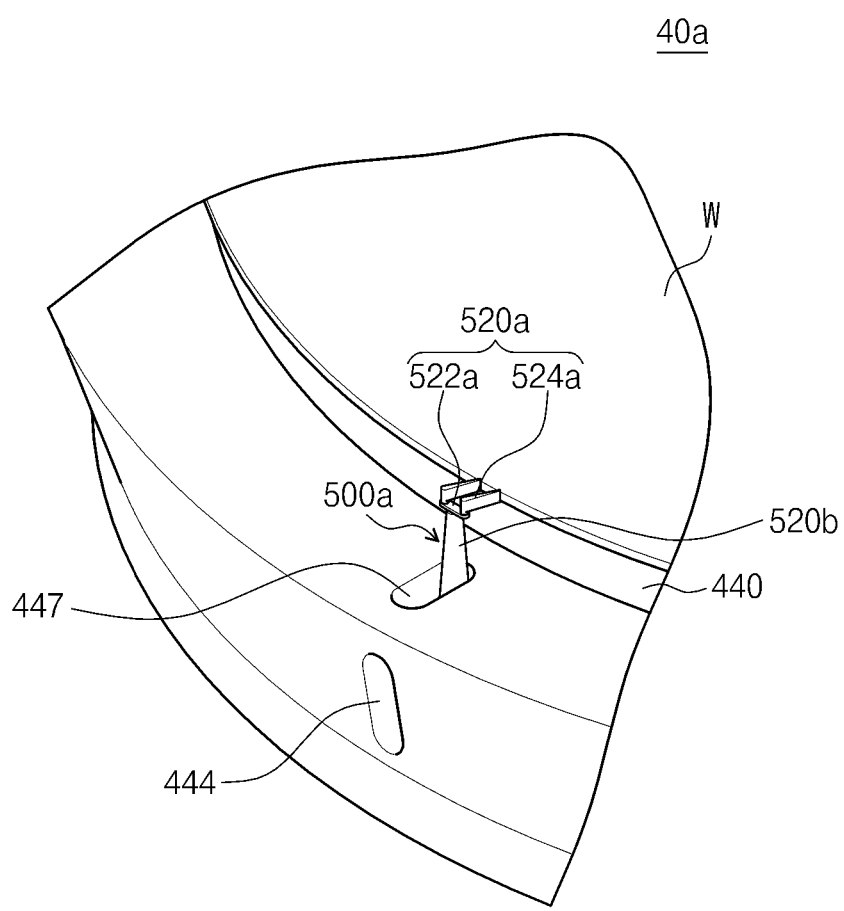
FIG. 15 is an enlarged perspective view illustrating a chuck pin installed at a body of the spin head of FIG. 14.
Figure 16:
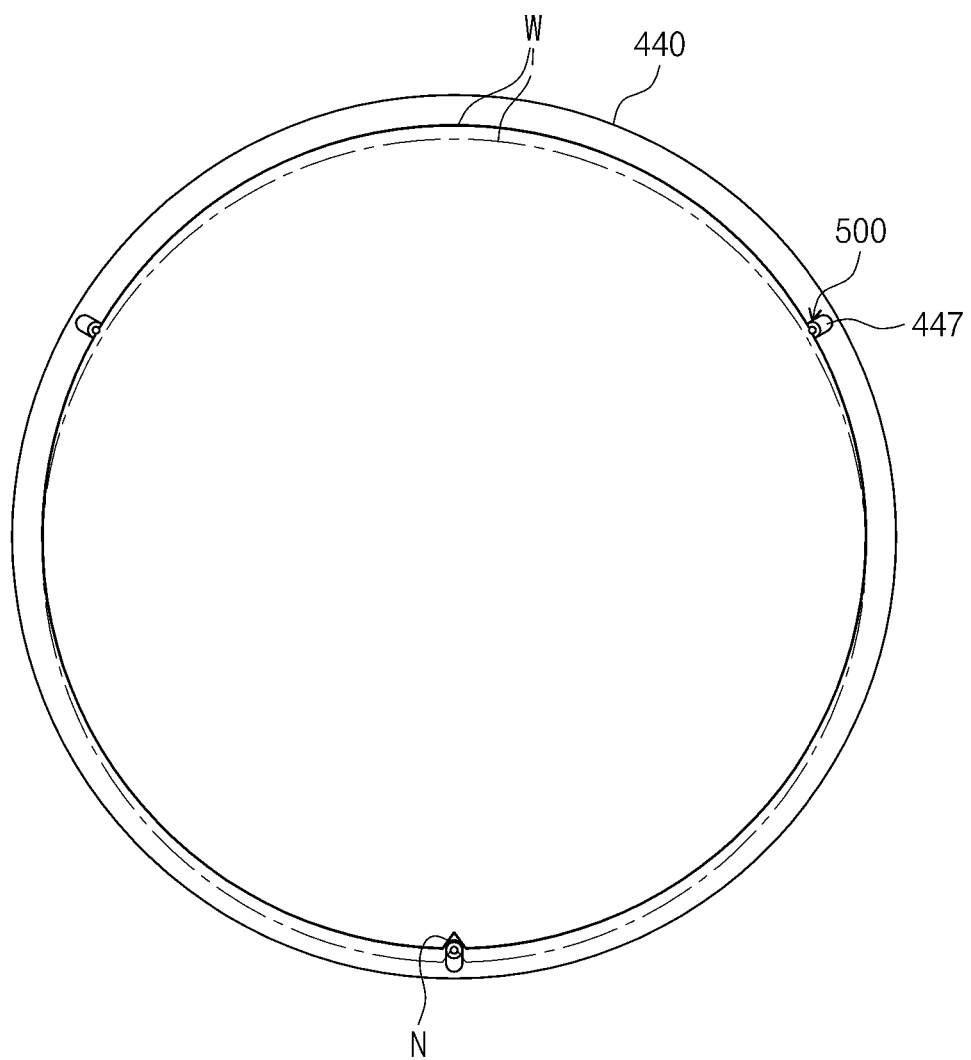
FIGS. 16 and 17 are schematic views illustrating substrates supported by the chuck pins of FIG. 4 and chuck pins of FIG. 14.
Figure 17:
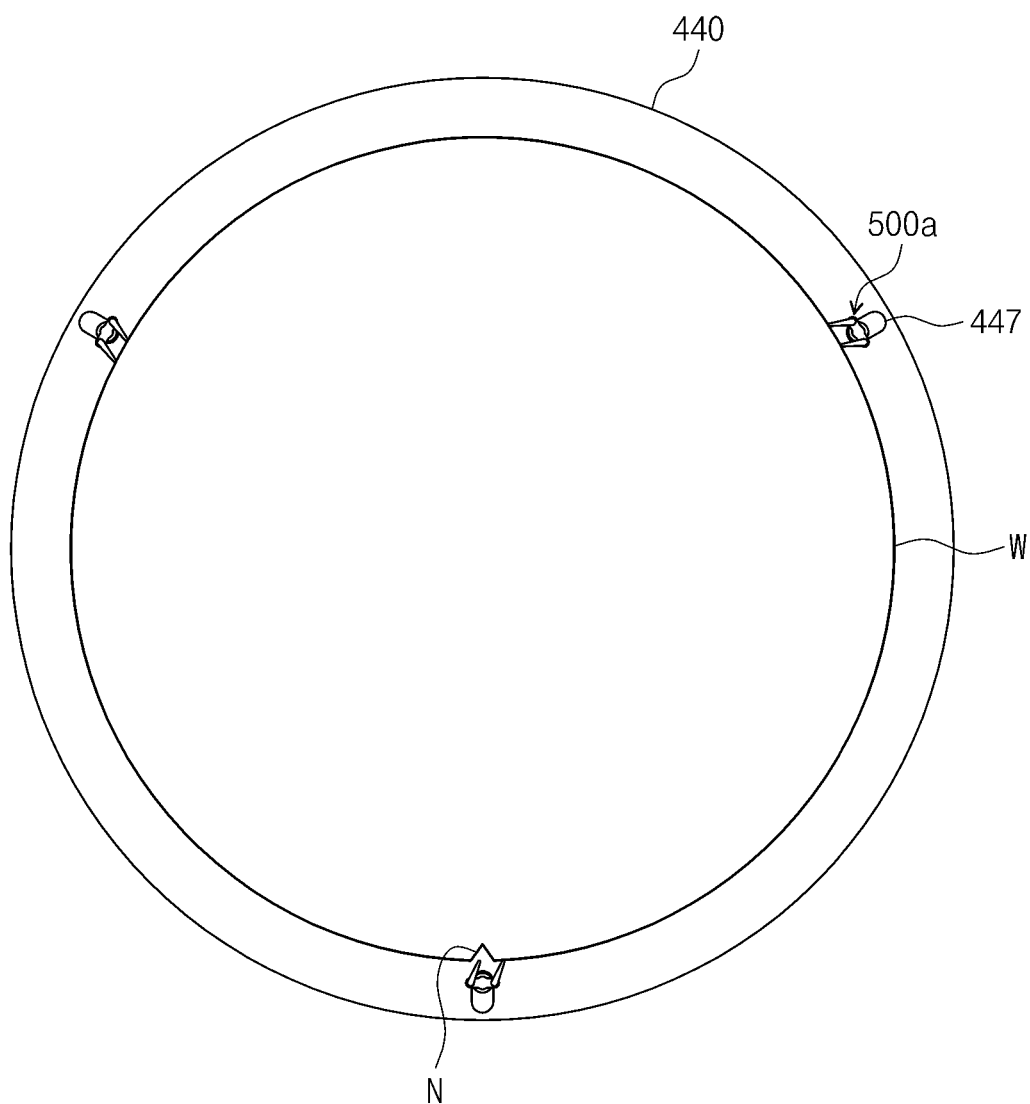

FIG. 14 is a plan view illustrating a spin head 40a according to an embodiment of the present disclosure. The spin head 40a has a similar structure to that of the spin head 40 of the previous embodiment except that chuck pins 500a of the spin head 40a has different shapes from those of the chuck pins 500 of the spin head 40. FIG. 15 is an enlarged perspective view illustrating the chuck pin 500a installed at the spin head 40a. The chuck pins 500a have an identical shape and size. The chuck pin 500a includes a support portion 520a, a middle portion 540a, and a coupling portion (not shown). The support portion 520a includes a base 522a and contacts 524a. The base 522a has an approximately flat plate shape, and supports the contacts 524a. In the current embodiment, the number of the contacts 524a is two. Each of the contacts 524a has a first end fixed onto the base 522a and a second end protruding to the center of the substrate W. The second end of the contact 524a is in contact with the lateral surface of the substrate W when the chuck pin 500a is disposed at a supporting position. The longitudinal direction of the contact 524a is parallel to the radial direction of the substrate W. The contact 524a has a streamline shape, and decreases in width from the first end to the second end at a top view. The contacts 524a are parallel to each other at the same height, and spaced apart from each other. The middle portion 540a has a cone shape gradually increasing in diameter downward. The coupling portion extends downward from the middle portion 540a. The coupling portion is provided with a screw hole for coupling to the chuck pin moving unit 600. The number of the chuck pins 500a is 3 or greater for stably supporting the substrate W. In the current embodiment, the number of the chuck pins 500a is 3. When the chuck pins 500 of the previous embodiment are used, the number of the chuck pins 500 is 5 or greater for stably supporting the substrate W. When the number of the chuck pins 500 is less than 5, one of the chuck pins 500 may be disposed in a notch N of the substrate W as illustrated in FIG. 16. In this case, the chuck pin 500 is not in contact with the substrate W, so that the substrate W is unstably supported. However, referring to FIG. 17, although the three chuck pins 500a are used and one of the contacts 524a of the chuck pin 500a is disposed in the notch N of the substrate W, the other one of the contacts 524a stably supports the substrate W.

Spin Head

Another Embodiment

Figure 18:
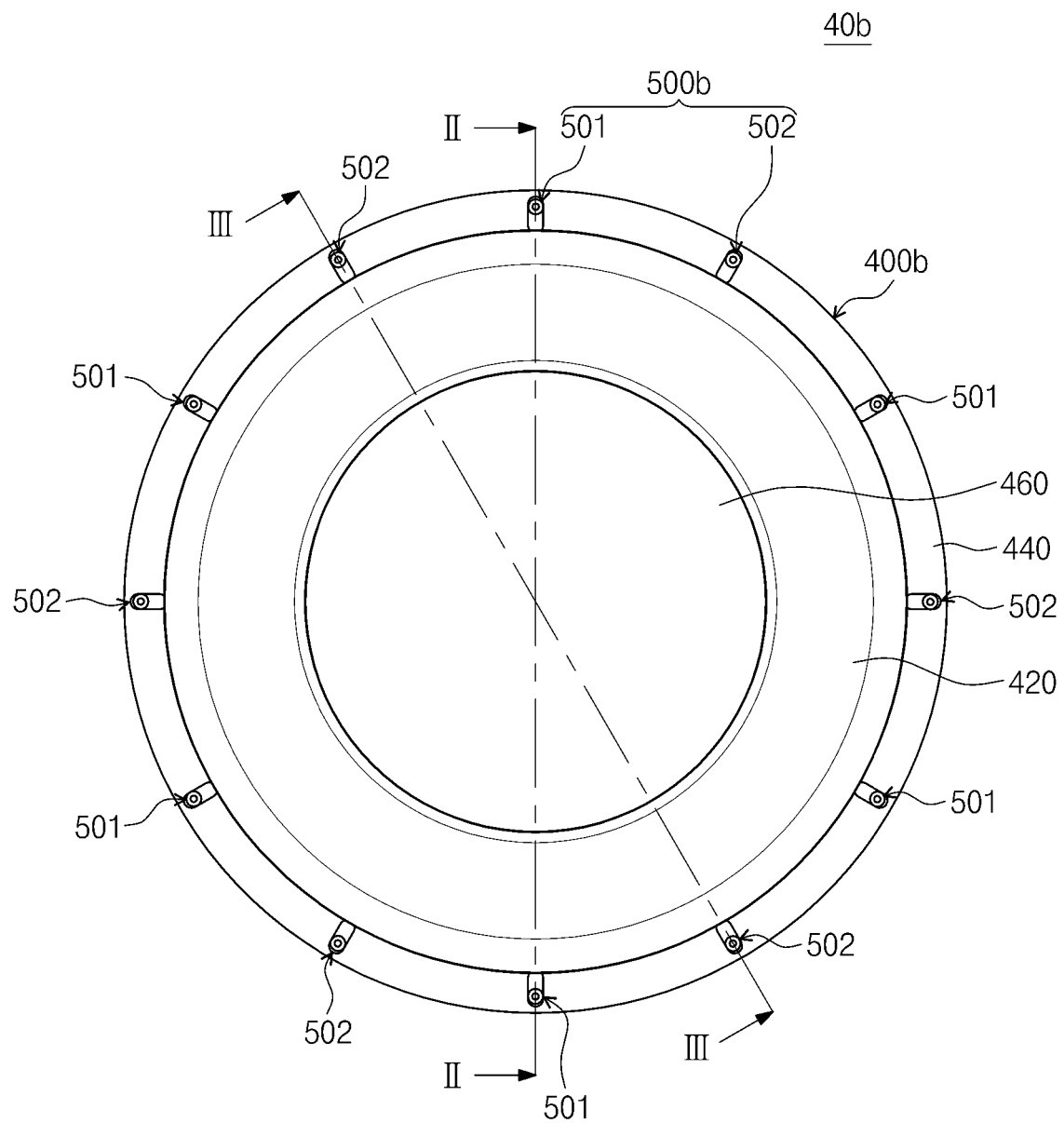
FIG. 18 is a plan view illustrating a spin head according to another embodiment of the present disclosure.
Figure 19:
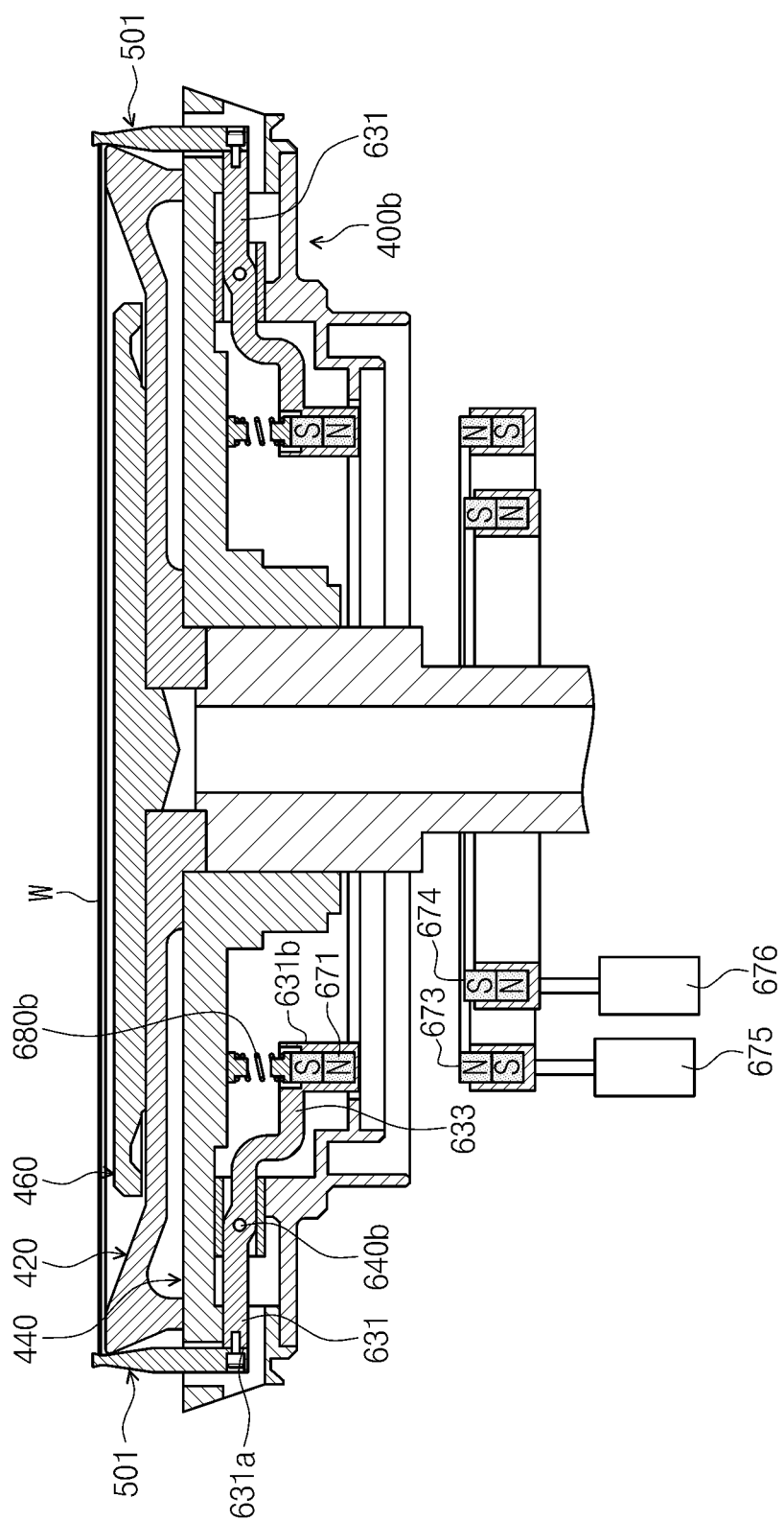
FIG. 19 is a cross-sectional view taken along line II-II of FIG. 18.
Figure 20:
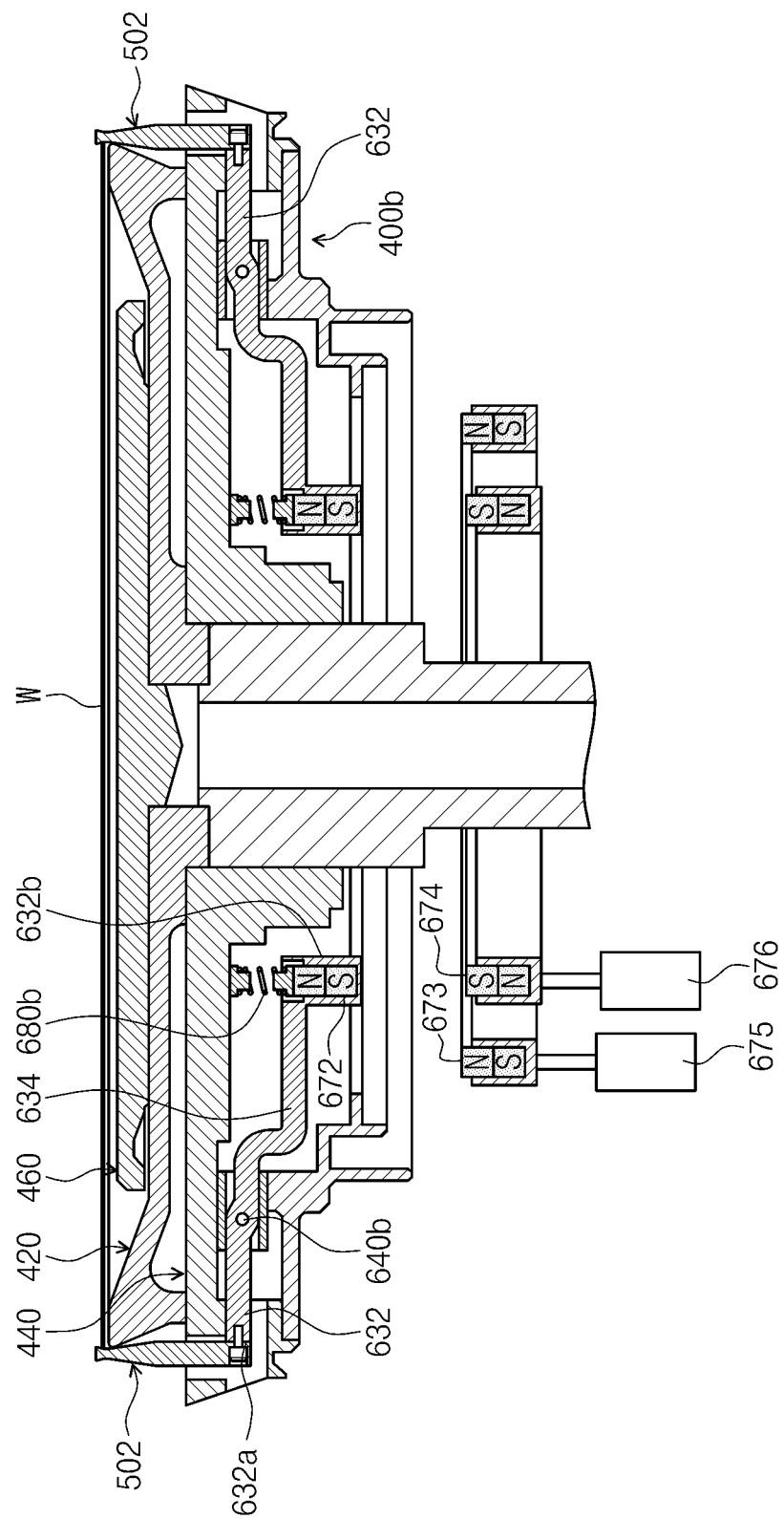
FIG. 20 is a cross-sectional view taken along line III-III of FIG. 19.

FIGS. 18 through 20 illustrate a spin head 40*b* according to an embodiment of the present disclosure. FIG. 18 is a plan view illustrating the spin head 40*b*, FIG. 19 is a cross-sectional view taken along line II-II of FIG. 18, and FIG. 20 is a cross-sectional view taken along line III-III of FIG. 18. The spin head 40*b* includes a gas supplying member 300*b*, a body 400*b*, chuck pins 500*b*, and a chuck pin moving unit 600*b*. The gas supplying member 300*b* and the body 400*b* have similar structures to those of the gas supplying member 300 and the body 400 constituting the spin head 40 of the previous embodiment.

The chuck pins 500*b* are classified into a first group and a second group. The chuck pins 500*b* included in the first group are referred to as first pins 501, and the chuck pins 500*b* included in the second group are referred to as second pins 502. When a process is performed, regions of the lateral portion of the substrate W contacting the chuck pins 500 are not exposed to process solution or gas, and thus, are not treated in the process. However, in the current embodiment, since the chuck pins 500*b* are classified into the first and second groups, when a process is performed, the first and second groups alternately support the substrate W, thus treating the whole regions of the support portion of the substrate W with process solution or gas.

The first pins 501 and the second pins 502 have the same shape and structure as those of the chuck pins 500 provided to the spin head 40 of the previous embodiment. The number of the first pins 501 is equal to the number of the second pins 502. The first pins 501 and the second pins 502 are alternately disposed. That is, one of the second pins 502 is disposed between the two neighboring first pins 501. The number of the first pins 501 is 5 or greater, and the number of the second pins 502 is 5 or greater. In the current embodiment, the number of the first pins 501 is 6, and the number of the second pins 502 is 6.

Figure 21:
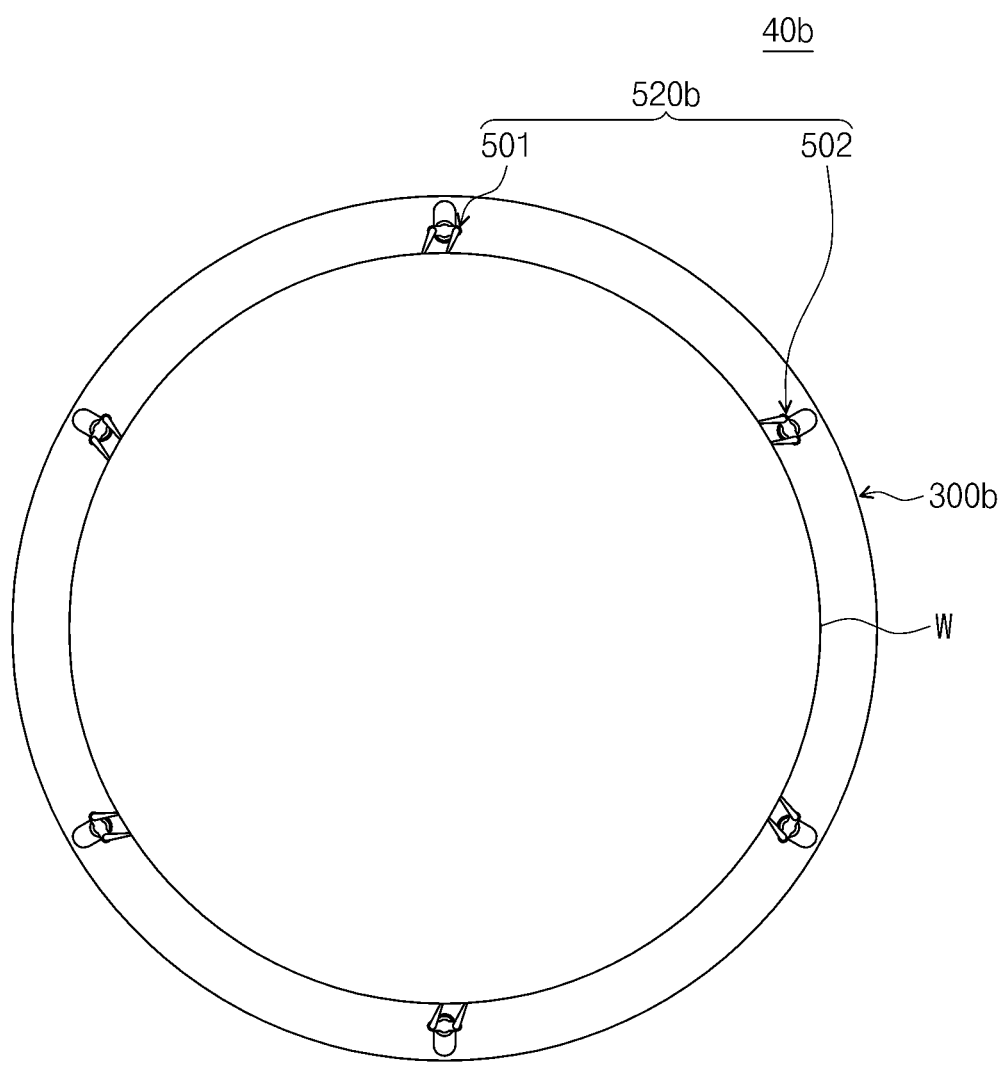
FIG. 21 is a schematic view illustrating a modification of the embodiment of FIG. 18 to which the chuck pin of FIG. 15 is applied.

Alternatively, referring to FIG. 21, the first pins 501 and the second pins 502 may have the same shape and structure as those of the chuck pins 500*a* provided to the spin head 40*a* of the previous embodiment. In this case, the number of the first pins 501 is 3 or greater, and the number of the second pins 502 is 3 or greater. In FIG. 21, the number of the first pins 501 is 3, and the number of the second pins 502 is 3.

The chuck pin moving unit 600*b* includes rotation rods 620*b*, pivot pins 640*b*, a driving member 660*b*, and elastic members 680*b*. The rotation rods 620*b* include first rods 631 and second rods 632. The first rods 631 are coupled to the first pins 501, and the second rods 632 are coupled to the second pins 502. The first rods 631 and the second rods 632 have approximately the same structures and shapes as those of the rotation rod 620 of the spin head 40 of the previous embodiment except that the first rods 631 are shorter than the second rods 632. Outer ends 631*a* of the first rods 631 and outer ends 632*a* of the second rods 632 are spaced approximately the same distance from the center of the body 400, but inner ends 632*b* of the second rods 632 are closer to the center of the body 400 than inner ends 631*b* of the first rods 631. The length of a second part 633 of the first rod 631 may be less than the length of a second part 634 of the second rod 632, so as to cause the length difference between the first rod 631 and the second rod 632.

The pivot pins 640*b* and the elastic members 680*b* have similar structures and arrangements as those of the pivot pins 640 and the elastic members 680 constituting the spin head 40 of the previous embodiment. The pivot pins 640*b* and the elastic members 680*b* are provided to the first rods 631 and the second rods 632.

The driving member 660*b* includes first driven magnets 671, second driven magnets 672, first driving magnets 673, second driving magnets 674, a first driver 675, and a second driver 676. The first driven magnets 671 and the second driven magnets 672 have similar structures and arrangements to those of the driven magnet 662 constituting the spin head 40 of the previous embodiment except that the first driven magnets 671 are fixed to the first rods 631 and the second driven magnets 672 are fixed to the second rods 631. Since the first rods 631 are shorter than the second rods 632, the first driven magnets 671 are farther from the center of the body 400 than the second driven magnets 672 are. The first driving magnet 673 and the second driving magnet 674 have similar structures and shapes to those of the driving magnet 664 constituting the spin head 40 of the previous embodiment except that the first driving magnet 673 face the first driven magnets 671 and the second driving magnet 674 face the second driven magnets 672. The first driving magnet 673 has a ring shape with a greater diameter than that of the second driving magnet 674. The first driving magnet 673 surrounds the second driving magnet 674. The first driver 675 and the second driver 676 have similar structures to that of the driver 666 constituting the spin head 40 of the previous embodiment. The first driver 675 moves the first driving magnet 673 between a first position and a second position, and the second driver 676 moves the second driving magnet 674 between the first position and the second position.

The first driving magnet 673, the first driven magnets 671, the second driven magnets 672 are arranged such that one of repulsion and attraction is applied between the first driving magnet 673 and the first driven magnets 671 and the other of repulsion and attraction is applied between the first driving magnet 673 and the second driven magnets 672. The second driving magnet 674 is disposed such that one of repulsion and attraction is applied between the second driving magnet 674 and the first driven magnets 671 and the other of repulsion and attraction is applied between the second driving magnet 674 and the second driven magnets 672. For example, the same poles of the first driving magnet 673 and the first driven magnets 671 face each other. The same poles of the second driving magnet 674 and the second driven magnets 672 face each other. The upper surface of the first driving magnet 673 has a pole different from that of the upper surface of the second driving magnet 674. For example, the upper portion of the first driving magnet 673 has an N pole and the lower portion thereof has an S pole, and the upper portions of the first driven magnets 671 have S poles and the lower portions thereof have N poles. In addition, the upper portion of the second driving magnet 674 has an S pole and the lower portion thereof has an N pole, and the upper portions of the second driven magnets 672 have N poles and the lower portions thereof have S poles.

Figure 22:
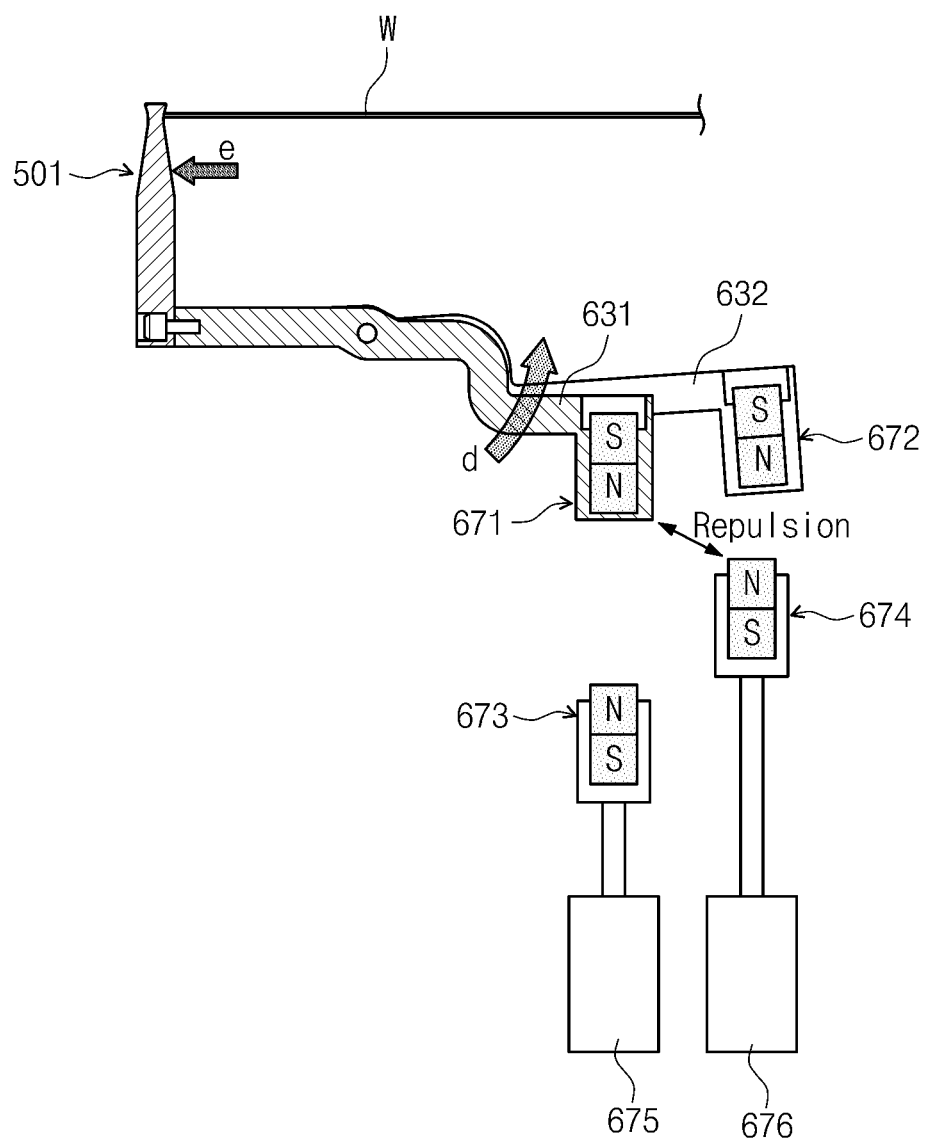
FIGS. 22 and 23 are schematic views illustrating forces applied to a driven magnet and a driving magnet according to pole arrangement between magnets, according to an embodiment of the present disclosure.
Figure 23:
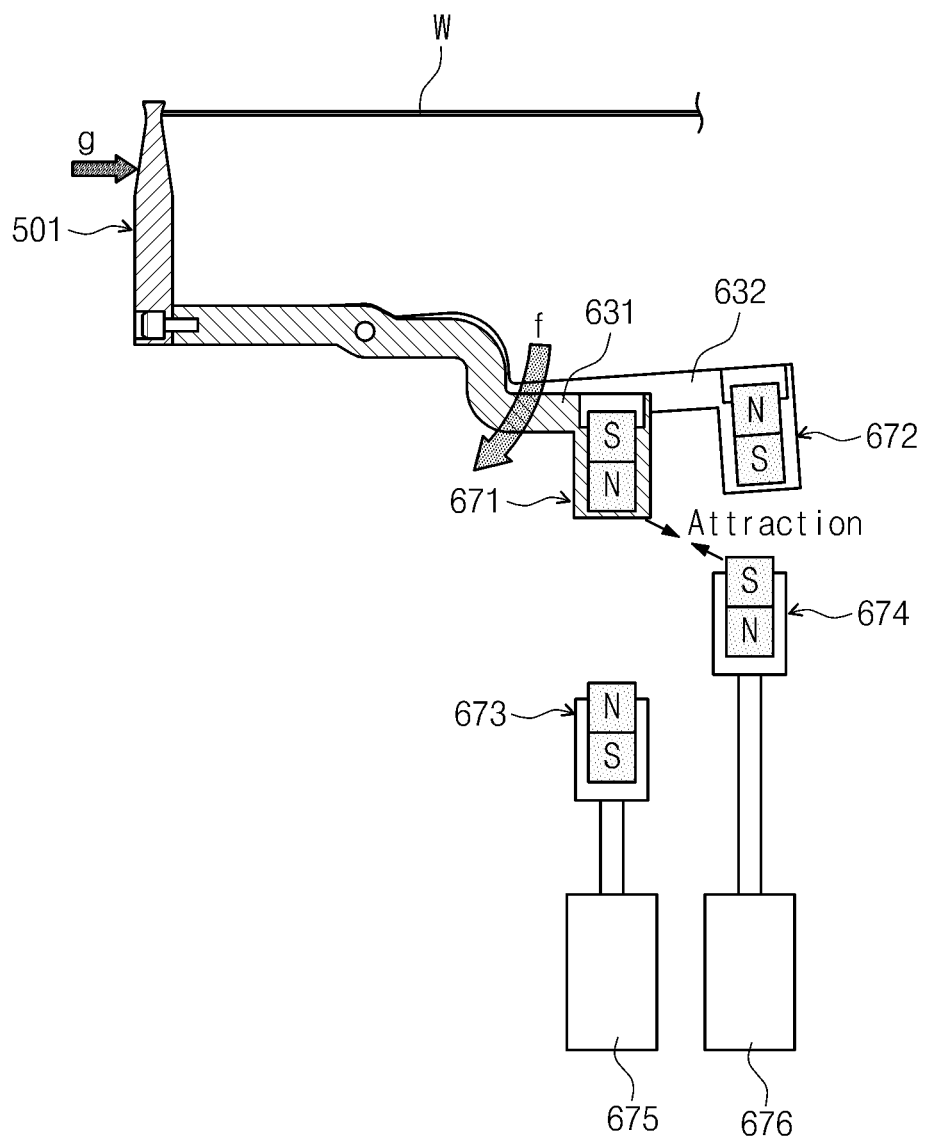

FIGS. 22 and 23 are schematic views illustrating a case where the upper surface of the first driving magnet 673 and the upper surface of the second driving magnet 674 have the same poles, and a case where they have the different poles. In the following descriptions, the second pins 502 are disposed at waiting positions, and the first pins 501 are disposed at supporting positions.

Referring to FIG. 22, in the state where the second pins 502 are disposed at the waiting positions and the first pins 501 are disposed at supporting positions, when the upper surface of the first driving magnet 673 and the upper surface of the second driving magnet 674 have the same poles, repulsion is applied between the second driving magnet 674 and the first driven magnet 671, and when a force 'd' is applied to the first rod 631 to be rotated counterclockwise, a force 'e' is applied to the first pin 501 from the supporting position to the waiting position. Accordingly, the first pins 501 move away from the lateral portion of the substrate W, and the substrate W is not stably supported any more. On the contrary, referring to FIG. 23, when the upper surface of the first driving magnet 673 and the upper surface of the second driving magnet 674 have the different poles, attraction is applied between the second driving magnet 674 and the first driven magnets 671. Thus, a force 'f' is applied to the first rod 631 to be rotated clockwise, and a force 'g' is applied to the first pins 501 toward the substrate W, so that the substrate W can be supported more stably.

Figure 24:
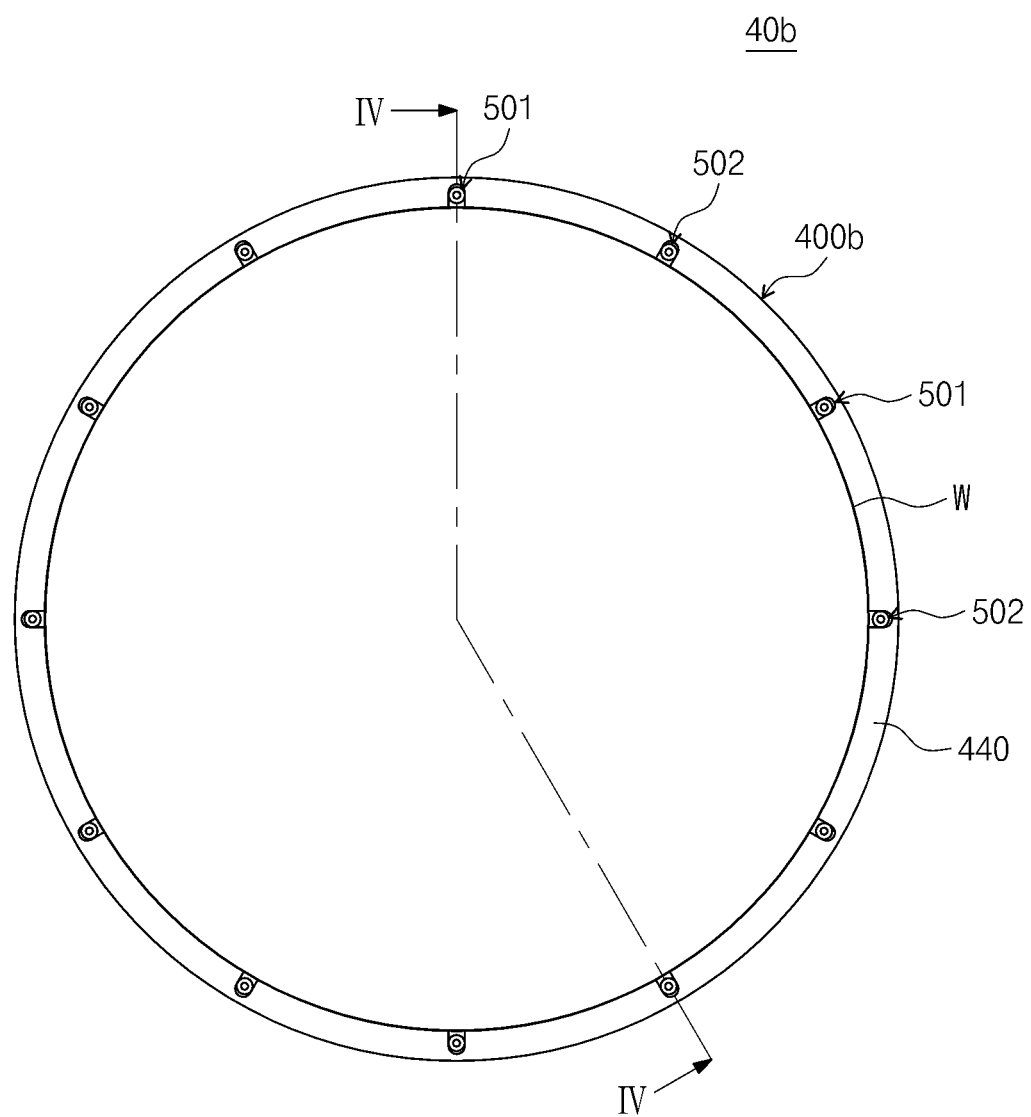
FIGS. 24 and 25 are a plan view and a cross-sectional view illustrating the spin head of the embodiment of FIG. 18 when a substrate is loaded or unloaded.
Figure 25:
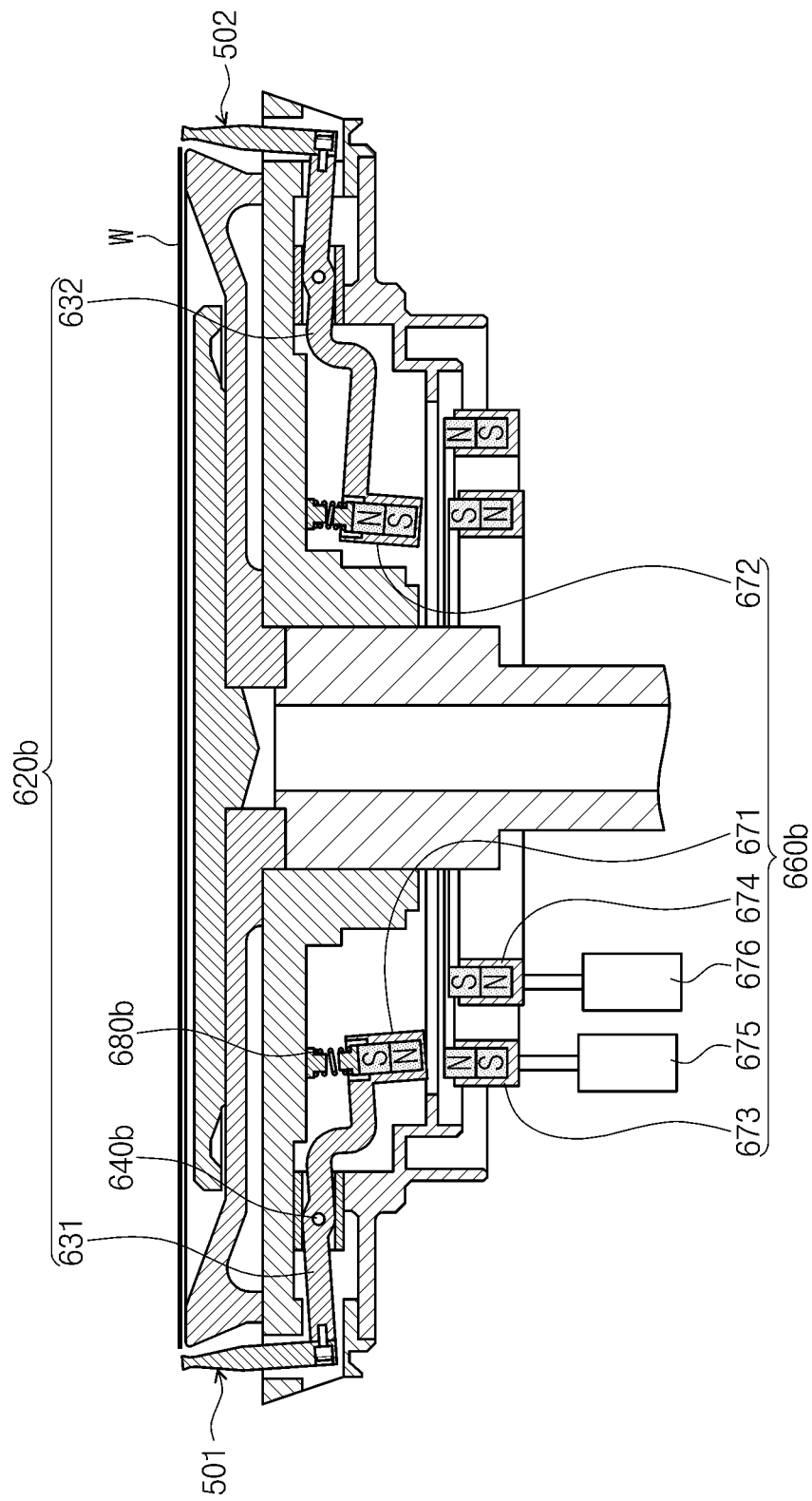
Figure 26:
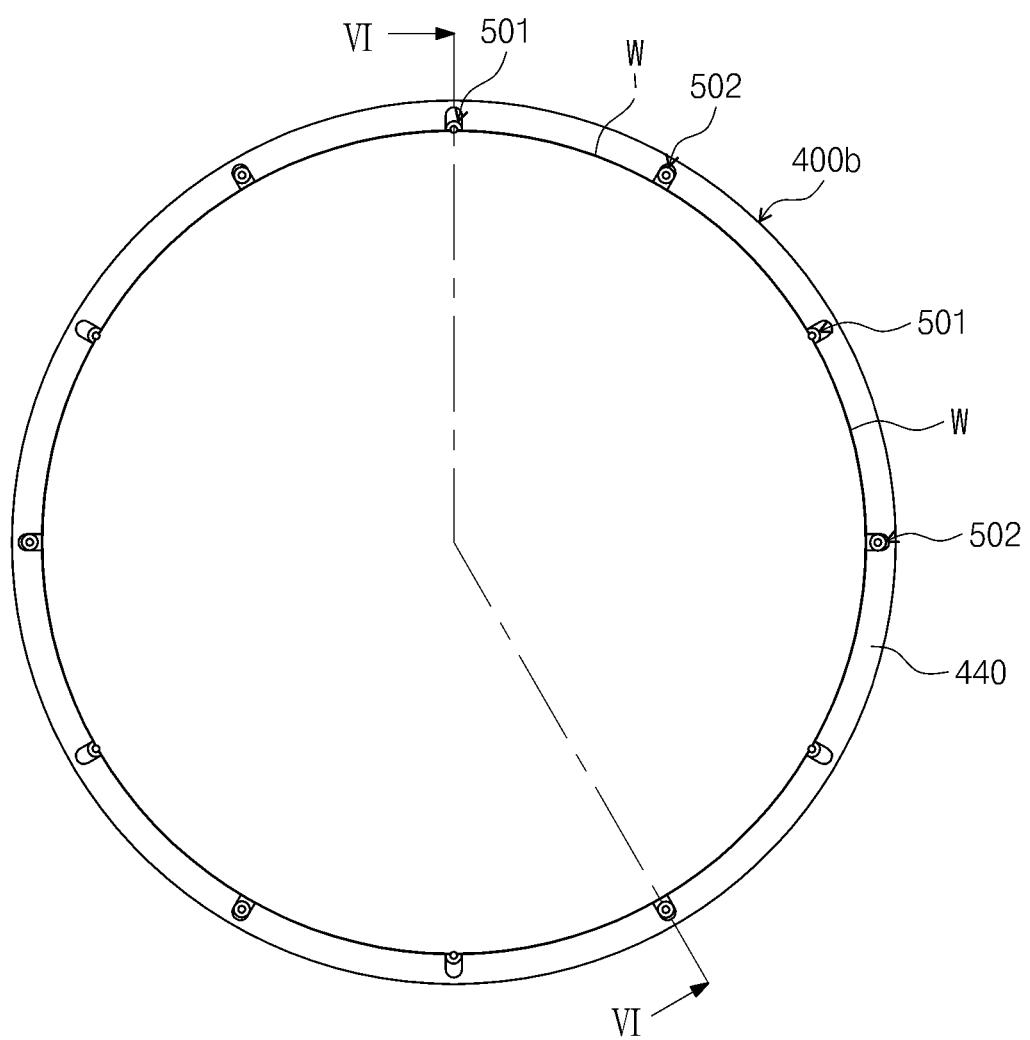
FIGS. 26 and 27 are a plan view and a cross-sectional view illustrating the spin head of the embodiment of FIG. 18 when a substrate is supported only by first pins.
Figure 27:
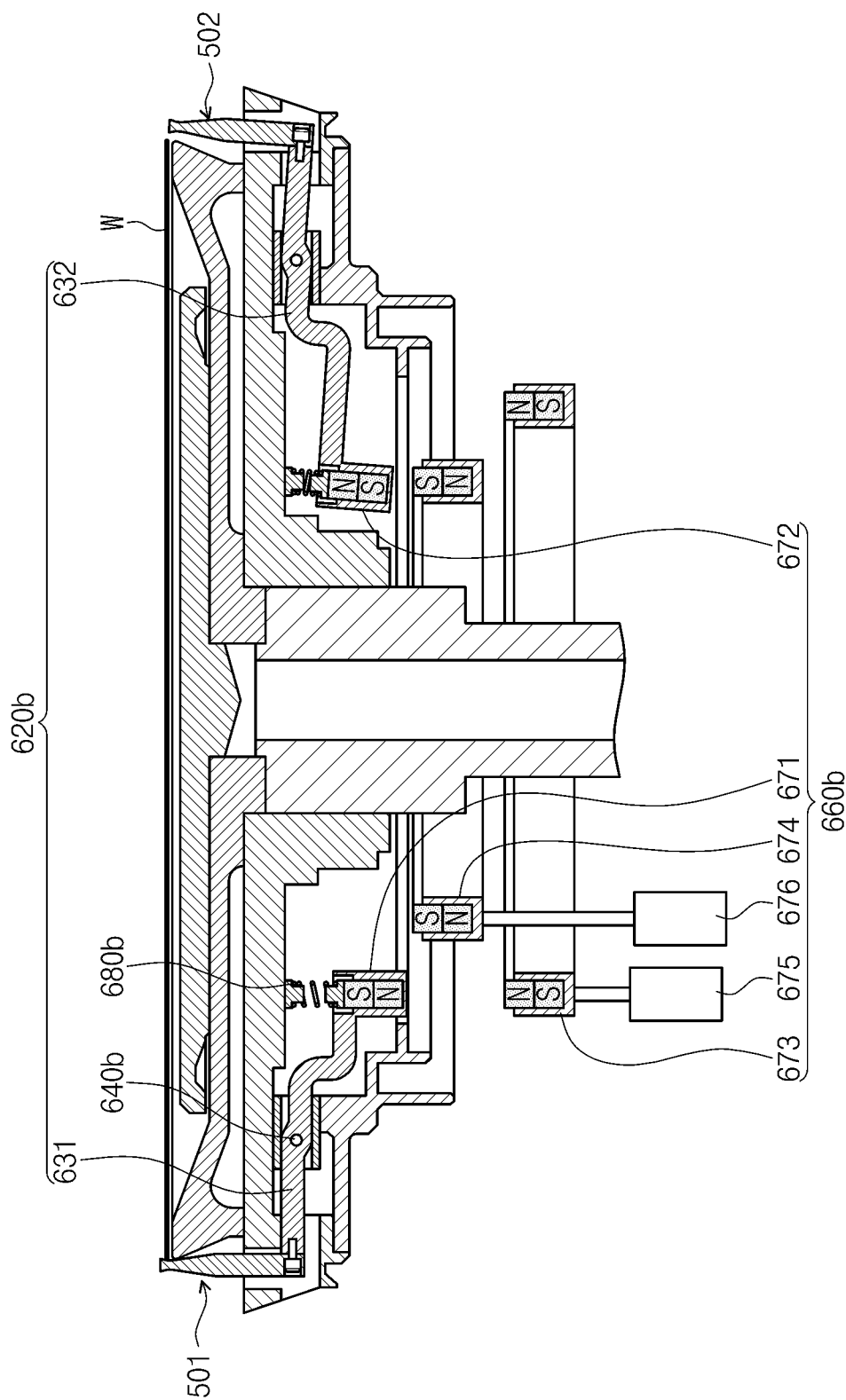
Figure 28:
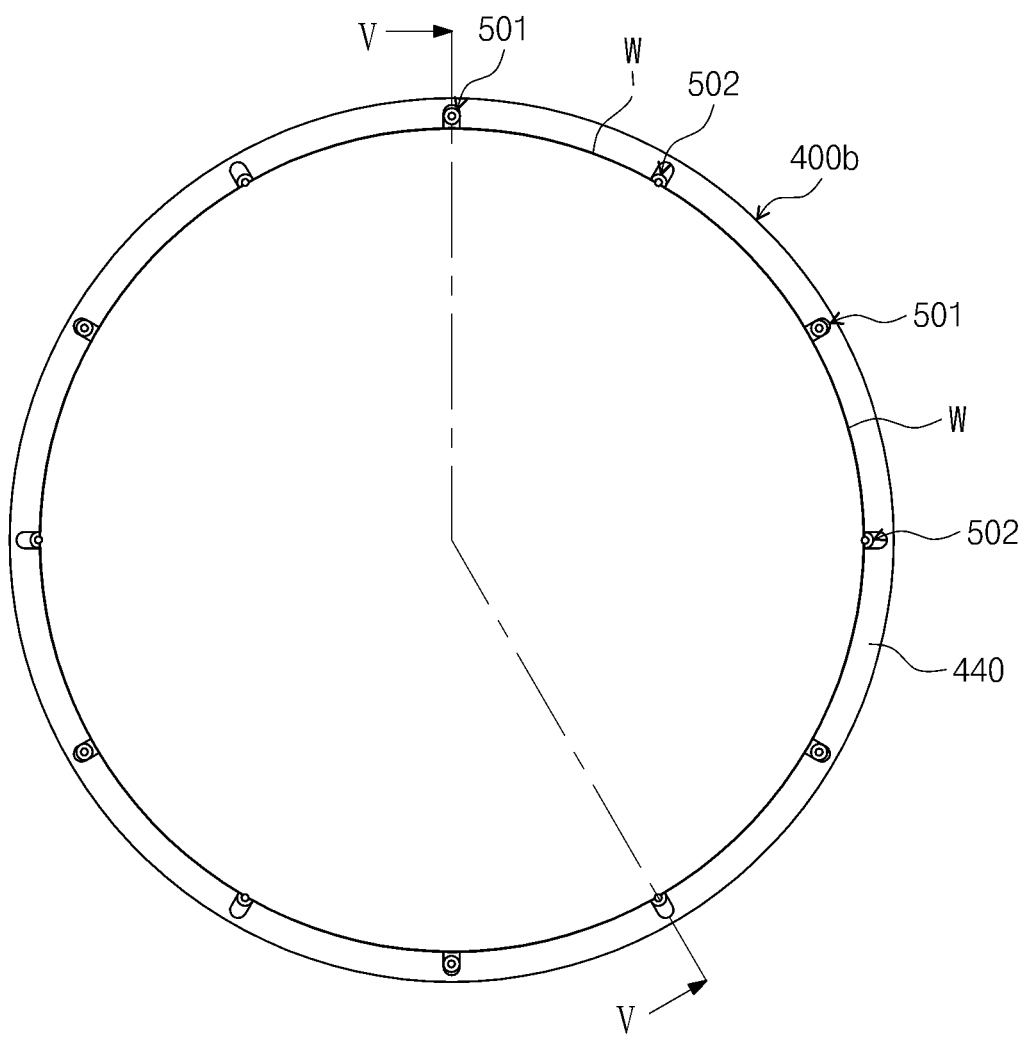

FIGS. 24 through 29 illustrate states of the chuck pins 500b and the chuck pin moving unit 600b during a process. FIGS. 24, 26 and 28 are plan views illustrating the spin head 40b. FIGS. 25, 27 and 29 are cross-sectional views taken along line IV-IV, line V-V, and line VI-VI of FIGS. 24, 26 and 28, respectively. Referring to FIGS. 24 and 25, when the substrate W is loaded on or unloaded from the spin head 40b, the first driving magnet 673 and the second driving magnet 674 are raised to the first position, and the first pins 501 and the second pins 502 are disposed at the waiting positions. Thereafter, referring to FIGS. 26 and 27, the first driving magnets 673 are moved to the second position, and the second driving magnets 674 are maintained at the first position. The first pins 501 are moved to the waiting positions, and the substrate W is supported by the second pins 502. The substrate W is rotated, and process solution or process gas are supplied to the substrate W to process, so that the substrate W is treated. When a predetermined time has elapsed, referring to FIGS. 28 and 29, the second driving magnets 674 are moved to the second positions, and the second pins 502 contact the substrate W. Thereafter, the first driving magnets 673 are moved to the first positions, and the first pins 501 are moved away from the substrate W. When the process is performed in the state where the substrate W is supported only by the first pins 501, lateral regions of the substrate W contacting the second pins 502 are exposed to the process solution or the process gas. When the process is performed in the state where the substrate W is supported only by the second pins 502, lateral regions of the substrate W contacting the first pins 501 are exposed to the process solution or the process gas.

According to the embodiment of the present disclosure, even when a substrate rotates at a high speed, the chuck pins are stably maintained at contact positions with the lateral portion of the substrate.

According to the embodiment of the present disclosure, even when one of the chuck pins faces a notch of a substrate, the chuck pins stably support the substrate.

According to the embodiment of the present disclosure, a substrate can be stably supported only by a small number of chuck pins.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A spin head comprising:
   a body;
   chuck pins protruding upward from the body; and
   a chuck pin moving unit configured to move the chuck pins between supporting positions where a lateral portion of a substrate placed on the spin head is supported and waiting positions that are farther from a center of the body than the supporting positions are so as to allow the substrate to be placed on the body,
   wherein the chuck pin moving unit includes:
      pivot pins; and
      rotation rods, each of which is coupled with each of the chuck pins, each of the rotation rods comprising:
         a first part that is a region coupled with a corresponding chuck pin with respect to a corresponding pivot pin of the pivot pins; and
         a second part that is an opposite region to the first part with respect to the corresponding pivot pin,
         wherein the second part includes:
            a first region; and
            a second region that is farther from the first part than the first region is and is lower than the first region,
      wherein a top line portion of the second region is parallel to a top line portion of the first region,
      wherein the second part further includes a third region extending from the first region to the second region,
      wherein the first part comprises a top line portion extending from the top line portion of the first region and parallel to the top line portion of the second region, and the top line portion of the first part is higher than the top line portion of the second region of the second part, and
      wherein each of the pivot pins is fixing each of the rotation rods to the body; and
   a driving member rotating the rotation rods about the pivot pins as a rotation shaft.

2. The spin head of claim 1, wherein the third region of each of the rotation rods is perpendicular to the first and the second regions of each of the rotation rods.

3. The spin head of claim 1, wherein an end of the second part of each of the rotation rods, which is adjacent to the center of the body, is lower than an end of the first part of each of the rotation rods, which is farthest from the center of the body.

4. The spin head of claim 1, wherein, when the body rotates, the rotation rods are supplied to use reverse centrifugal force to apply force to the chuck pins from the waiting positions to the supporting positions.

5. The spin head of claim 1, wherein the body comprises stoppers, each of the stoppers having:
   a through hole with an open front portion and an open rear portion,
   wherein one rotation rod of the rotation rods passes through the through hole,
   wherein one pivot pin couples the one rotation rod to a stopper in the through hole, and
   wherein the through hole has a diameter greater than a thickness of the one rotation rod.

6. The spin head of claim 1, wherein the second part of each of the rotation rods is heavier than the first part of each of the rotation rods.

7. The spin head of claim 1, wherein the driving member is supplied to move the chuck pins from the supporting positions to the waiting positions by magnetic force.

8. The spin head of claim 1, wherein the driving member comprises:
   driven magnets coupled to second parts of the rotation rods; and a driving magnet facing the driven magnets under the driven magnets,
wherein the driven magnets and the driving magnet have identical poles facing each other.

9. The spin head of claim 8, wherein the driving magnet has a ring shape.

10. The spin head of claim 8,
wherein the driven magnets and the driving magnet comprise permanent magnets, and
wherein the driving member further comprises a driver configured to vertically move the driving magnet.

11. The spin head of claim 8, further comprising elastic members coupled to the rotation rods and the body and rotating the rotation rods to apply force to the chuck pins from the waiting positions to the supporting positions.

12. The spin head of claim 11,
wherein each of the elastic members comprises a spring, and
wherein the spring of each of the elastic members has an end coupled to a second part of a corresponding rotation rod and the other end coupled to the body at an upper side of the corresponding rotation rod.

13. The spin head of claim 8, wherein a sum of a weight of the second part and a weight of the driven magnet of each of the driving members is greater than a sum of a weight of the first part of each of the rotation rods and a weight of each of the chuck pins.

14. The spin head of claim 1,
wherein one part of the chuck pins is classified into a first group, and the other part of the chuck pins is classified into a second group,
wherein the rotation rods include:
  first rods coupled with the first group; and
  second rods coupled with the second group,
wherein one part of the driven magnets is classified into first driven magnets and the other part of the driven magnets is classified into second driven magnets,
wherein the driving magnet includes a first driving magnet and a second driving magnet, and
wherein the driving member include:
  the first driven magnets connected to the first rods;
  the second driven magnets connected to the second rods;
  the first driving magnet facing the first driven magnets; and
  the second driving magnet facing the second driven magnets.

15. The spin head of claim 14,
wherein the first driven magnets are farther from the center of the body than the second driven magnets are, and
wherein the first and second driving magnets have ring shapes, respectively.

16. The spin head of claim 15,
wherein the first driven magnets, the second driven magnets, the first driving magnet, and the second driving magnet, respectively, comprise permanent magnets, and
wherein the driving member further comprises:
  a first driver vertically moving the first driving magnet; and
  a second driver vertically moving the second driving magnet.

17. The spin head of claim 16,
wherein the first driving magnet and the first driven magnets have identical poles facing each other,
wherein the second driving magnet and the second driven magnets have identical poles facing each other, and
wherein an upper of the first driving magnet and an upper of the second driving magnet have different poles from each other.

18. The spin head of claim 17,
wherein the first rods and the second rods have different lengths from each other,
wherein the first driven magnets are provided to an end of the first rods, and
wherein the second driven magnets are provided to an end of the second rods.

19. The spin head of claim 14,
wherein the number of the chuck pins provided to each of the first group and the second group is five or greater, and
wherein the chuck pins included in the first group and the chuck pins included in the second group are disposed alternately.

20. The spin head of claim 1,
wherein each of the chuck pins comprises:
  a base; and
  a contact fixed to the base and protruding from the base to the center of the body such that the contact is adapted to be in contact with the substrate, and
wherein the contact is provided in plurality.

21. The spin head of claim 20, wherein the contacts are spaced apart from each other in a perpendicular direction to longitudinal directions respectively of the contacts.

22. The spin head of claim 1, wherein the body comprises:
a lower plate at which the chuck pin moving unit is installed;
an upper plate installed at an upper portion of the lower plate and having a concave space in an upper surface; and
a guide plate disposed in the concave space,
wherein a through hole vertically passes through a center of the lower plate and a through hole is disposed in a center of the upper plate and communicating with the through hole of the lower plate, and
wherein a conduit in which gas supplied through the through hole of the upper plate and the through hole of the lower plate flows is provided to a bottom of the guide plate.

23. The spin head of claim 22, wherein the conduit comprises:
a ring-shaped buffer space disposed at an edge of the guide plate;
a passage, as a recess, disposed in the bottom of the guide plate and connecting the buffer space to the through hole of the upper plate; and
a ring-shaped concave disposed in the bottom of the guide plate and extending from the buffer space to an outer end of the guide plate.

24. A substrate treating apparatus comprising:
a housing;
a spin head disposed in the housing and supporting a substrate; and
a fluid supplying unit supplying process solution or process gas onto the substrate placed on the spin head,
wherein the spin head includes:
  a body;
  chuck pins protruding upward from the body; and
  a chuck pin moving unit configured to move the chuck pins between supporting positions where a lateral portion of the substrate placed on the spin head is supported and waiting positions that are farther from a center of the body than the supporting positions are so as to allow the substrate to be placed on the body,
wherein the chuck pin moving unit includes:

pivot pins; and rotation rods, each of which is fixed to the body through each of the pivot pins, each of the rotation rods having a first part that is a region coupled with a corresponding chuck pin with respect to a corresponding pivot pin and having a second part that is an opposite region to the first part with respect to the corresponding pivot pin; and a driving member configured to rotate the rotation rods to vary heights of both ends of the rotation rods and to move the chuck pins between the supporting positions and the waiting positions, wherein the second part includes:
a first region; and
a second region that is farther from the first part than the first region is and is lower than the first region, wherein a top line portion of the second region is parallel to a top line portion of the first region, wherein the second part further includes a third region extending from the first region to the second region, and wherein the first part comprises a top line portion extending from the top line portion of the first region and parallel to the top line portion of the second region, and the top line portion of the first part is higher than the top line portion of the second region of the second part.

25. The substrate treating apparatus of claim 24, wherein one part of the chuck pins is classified into a first group, and the other part of the chuck pins is classified into a second group, wherein one part of the rotations rods is classified into first rods and the other part of the rotation rods is classified into second rods, wherein the rotation rods includes:
the first rods coupled with the chuck pins constituting the first group; and
the second rods coupled with the chuck pins constituting the second group, wherein the driving member includes:
first driven magnets being connected to the first rods;
second driven magnets being closer to the center of the body than the first driven magnets are and connected to the second rods;
a first driving magnet facing the first driven magnets; and
a second driving magnet facing the second driven magnets.

26. The substrate treating apparatus of claim 25, wherein the first and second driving magnets are respectively lower than the first and second driven magnets and have ring shapes, wherein the first driven magnets and the first driving magnet have identical poles facing each other, wherein the second driven magnets and the second driving magnet have identical poles facing each other, and wherein an upper of the first driving magnet and an upper of the second driving magnet have opposite poles to each other.

27. The spin head of claim 1, wherein the top line portion of the third region is inclined to gradually decrease in height from the first region to the second region.

28. The spin head of claim 24, wherein the top line portion of the third region is inclined to gradually decrease in height from the first region to the second region.

\* \* \* \* \*